(12) United States Patent
Huang et al.

(10) Patent No.: US 9,227,841 B2
(45) Date of Patent: Jan. 5, 2016

(54) APPARATUS INTEGRATING MICROELECTROMECHANICAL SYSTEM DEVICE WITH CIRCUIT CHIP AND METHODS FOR FABRICATING THE SAME

(71) Applicants: Chao Ta Huang, Hsinchu (TW); Shih Ting Lin, Hualien (TW); Yu Wen Hsu, Tainan (TW)

(72) Inventors: Chao Ta Huang, Hsinchu (TW); Shih Ting Lin, Hualien (TW); Yu Wen Hsu, Tainan (TW)

(73) Assignee: INDUSTRIAL TECHNOLOGY RESEARCH INSTITUTE, Chutung, Hsinchu (TW)

( * ) Notice: Subject to any disclaimer, the term of this patent is extended or adjusted under 35 U.S.C. 154(b) by 0 days.

(21) Appl. No.: 14/274,118

(22) Filed: May 9, 2014

(65) Prior Publication Data

US 2014/0248731 A1   Sep. 4, 2014

Related U.S. Application Data

(62) Division of application No. 13/173,119, filed on Jun. 30, 2011, now Pat. No. 8,809,972.

(30) Foreign Application Priority Data

Jun. 30, 2010 (TW) ................................ 99121392 A

(51) Int. Cl.
| | |
|---|---|
| *H01L 41/08* | (2006.01) |
| *B81C 1/00* | (2006.01) |
| *B81B 7/00* | (2006.01) |
| *H01L 41/113* | (2006.01) |
| *H01L 41/09* | (2006.01) |

(52) U.S. Cl.
CPC ........... *B81C 1/00134* (2013.01); *B81B 7/0064* (2013.01); *B81C 1/0023* (2013.01); *B81C 2203/00* (2013.01); *B81C 2203/0792* (2013.01); *H01L 41/0933* (2013.01); *H01L 41/1134* (2013.01); *H01L 2224/11* (2013.01)

(58) Field of Classification Search
None
See application file for complete search history.

(56) References Cited

U.S. PATENT DOCUMENTS

| 6,512,300 B2 | 1/2003 | Cheever et al. |
| 6,559,530 B2 | 5/2003 | Hinzel et al. |
| 6,808,955 B2 | 10/2004 | Ma |

(Continued)

FOREIGN PATENT DOCUMENTS

| CN | 101236944 A | 8/2008 |
| CN | 101286521 A | 10/2008 |

(Continued)

*Primary Examiner* — Benjamin Sandvik
(74) *Attorney, Agent, or Firm* — Egbert Law Offices, PLLC

(57) ABSTRACT

One embodiment discloses an apparatus integrating a microelectromechanical system device with a circuit chip which includes a circuit chip, a microelectromechanical system device, a sealing ring, and a lid. The circuit chip comprises a substrate and a plurality of metal bonding areas. The substrate has an active surface with electrical circuit area, and the metal bonding areas are disposed on the active surface and electrically connected to the electrical circuits. The microelectromechanical system device comprises a plurality of bases and at least one sensing element. The bases are connected to at least one of the metal bonding areas. The at least one sensing element is elastically connected to the bases. The sealing ring surrounds the bases, and is connected to at least one of the metal bonding areas. The lid is opposite to the active surface of the circuit chip, and is connected to the sealing ring to have a hermetic chamber which seals the sensing element and the active surface of the circuit chip.

27 Claims, 31 Drawing Sheets

(56) References Cited

U.S. PATENT DOCUMENTS

| | | | |
|---|---|---|---|
| 6,846,691 B2 | 1/2005 | Hsu et al. | |
| 6,892,575 B2 | 5/2005 | Nasiri et al. | |
| 6,946,314 B2 | 9/2005 | Sawyer et al. | |
| 7,104,129 B2 | 9/2006 | Nasiri et al. | |
| 7,250,112 B2 | 7/2007 | Nasiri et al. | |
| 7,514,760 B1 | 4/2009 | Quevy | |
| 7,821,085 B2* | 10/2010 | Suzuki | B81B 7/007 257/414 |
| 8,349,634 B2* | 1/2013 | Fujii | B81B 7/007 257/254 |
| 8,368,152 B2* | 2/2013 | Chu | B81C 1/00039 257/415 |
| 8,592,981 B2* | 11/2013 | Ebefors | B81B 7/0006 257/621 |
| 8,633,554 B2* | 1/2014 | Chu | B81C 1/00039 257/415 |
| 8,695,426 B2* | 4/2014 | Hsu | B81B 3/0086 73/504.12 |
| 9,085,455 B2* | 7/2015 | Cheng | B81C 3/001 |
| 2002/0054422 A1 | 5/2002 | Carr et al. | |
| 2005/0166677 A1 | 8/2005 | Nasiri et al. | |
| 2009/0122651 A1* | 5/2009 | Kupnik | B06B 1/0292 367/181 |

FOREIGN PATENT DOCUMENTS

| | | |
|---|---|---|
| CN | 101369592 A | 2/2009 |
| TW | 200844036 A | 11/2008 |
| TW | 200847347 A | 12/2008 |

* cited by examiner

APPARATUS INTEGRATING MICROELECTROMECHANICAL SYSTEM DEVICE WITH CIRCUIT CHIP AND METHODS FOR FABRICATING THE SAME

RELATED U.S. APPLICATIONS

The present application claims divisional priority from U.S. Provisional patent application Ser. No. 13/173,119, filed on Jun. 30, 2011 and entitled "Apparatus Integrating Microelectromechanical System Device with Circuit Chip and Methods for Fabricating the Same", presently pending.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

1. Field of the Invention

The disclosure relates to an MEMS (Microelectromechanical Systems) sensor, and more particularly to an integrated apparatus vertically stacking a microelectromechanical system device and an integrated circuit chip and methods for fabricating the same.

2. Description of Related Art Including Information Disclosed Under 37 CFR 1.97 and 37 CFR 1.98.

As MEMS (Microelectromechanical Systems) sensors have become increasingly common in consumer electronic products (for example, microphones for cellular phones or accelerometers for interactive game input devices), the MEMS sensor market has become correspondingly competitive, not only in terms of manufacturing cost, but also size and quality of hermetic sealing, which is required for certain MEMS applications, such as inertia devices (for example, accelerometer, angular rate sensor, oscillator, etc.), which require a hermetic chamber to maintain sensitivity. For MEMS sensors, scale of miniaturization and integrity of sealing process have become important quality factors.

Conventionally, MEMS sensors are fabricated by the steps of: fabricating the microelectromechanical system device and the integrated circuit chip respectively, integrating them into a sensing system by wire bonds; and disposing it in a package so as to form a system-in-package. But the integration is costly and can result in an large package. To reduce size and manufacturing cost, the industry has sought alternative methods for integrating the microelectromechanical system device and the integrated circuit into the same chip.

There are two basic methods of integrating a microelectromechanical system device and integrated circuit: plane integration and vertical integration. Plane integration can combine the microelectromechanical system device and the integrated circuit on the same silicon substrate, for example, by fabricating the microelectromechanical system device and the integrated circuit simultaneously on the silicon substrate of a chip by the CMOS (Complementary Metal Oxide Semiconductor) process. Alternatively, in order to reduce the footprint area of the sensing device, vertical integration can be utilized to stack the microelectromechanical system device on the integrated circuit chip vertically and form a hermetic chamber, which assures the MEMS inertia device (for example, an accelerometer, an angular rate sensor, an oscillator and so on) retains sensitivity during operation.

FIG. 1 shows a vertically integrated microelectromechanical system apparatus 10 disclosed by U.S. Pat. No. 7,104,129. As shown in FIG. 1, the vertically integrated microelectromechanical system apparatus 10 mainly comprises a hermetic chamber 14 constructed by a lid 12, an outer frame 13 and an integrated circuit chip 11. The microelectromechanical system device 16 is disposed in the hermetic chamber 14 and connected to the outer frame 13. The electrical signal sensed by the microelectromechanical system device 16 is transmitted to the integrated circuit chip 11 by a conductive bonding pad 17 disposed below the outer frame 13 at the periphery.

Although the vertically integrated microelectromechanical system apparatus 10 utilizes vertical stacking to reduce the footprint area of the whole device, the microelectromechanical system device 16 can only be connected to the outer frame 13 disposed at the periphery, and cannot be connected to other locations, which narrows its potential scope of application. On the other hand, in the vertically integrated microelectromechanical system apparatus 10, an insulating layer 15 is disposed between the outer frame 13 and the lid 12. Therefore, the vertically integrated microelectromechanical system apparatus 10 does not have the function for shielding electromagnetic interference, and the sensing signal in the vertically integrated microelectromechanical system apparatus 10 is easily affected by external electromagnetic interference. Moreover, although the vertically integrated microelectromechanical system apparatus 10 discloses the electrical connection from the microelectromechanical system device 16 to the integrated circuit chip 11 (first level interconnection), it does not disclose the electrical connection from the integrated circuit chip 11 to external electrical connection (second level interconnection). Therefore, the vertical integration only achieve limited reduction in footprint area for such a device.

During the process (please refer to the specification of U.S. Pat. No. 7,104,129), the wafer used for forming the lid 12 and the wafer used for forming the microelectromechanical system device 16 are stacked in order and are bonded together. If the above-mentioned two wafers are not precisely aligned with each other, alignment errors may be accumulated when the stacked wafers are bonded with the wafer used for forming the integrated circuit chip 11. The accumulated alignment error could result in bonding defects, thereby decreasing the yield rate of the final vertically integrated microelectromechanical system apparatus 10.

Therefore, it is necessary to provide a better structure and process for the vertically integrated microelectromechanical system apparatus to solve the above-mentioned problems such as narrow scope of application, vulnerability to electromagnetic interference, larger physical scale of the device and poor yield rate of fabrication.

BRIEF SUMMARY OF THE INVENTION

An embodiment of discloses an apparatus integrating a microelectromechanical system device with a circuit chip, which comprises a circuit chip, a microelectromechanical system device and a lid. The circuit chip comprises a substrate and a plurality of metal bonding areas, the substrate has an active surface with at least one electrical circuit area, and the metal bonding areas are disposed on the active surface and electrically connected to the electrical circuit area. The microelectromechanical system device comprises a plurality of bases, at least one sensing element and a sealing ring, the bases are connected to at least one of the metal bonding areas, and the at least one sensing element is elastically and electrically connected to the bases. The sealing ring surrounds the bases, and connects the at least one of the metal bonding areas. The lid is opposite to the active surface of the circuit chip, and connected to the sealing ring so as to form a hermetic chamber surrounding the at least one sensing element.

An embodiment discloses a method for fabricating an apparatus integrating a microelectromechanical system device with a circuit chip, which comprises the steps of:
  providing an SOI (Silicon on Insulator) wafer, wherein the SOI wafer comprises a device layer, an insulating layer and a handle layer stacked in order;
  etching the peripheral portion of the device layer to form at least one hole penetrating the insulating layer, and filling a conductive material therein so as to form a conductive pillar;
  etching a surface of the device layer so as to form a plurality of bottoms of the bases and the bottom of sealing ring;
  etching the device layer to the insulating layer so as to form etched pattern; integrating the above-mentioned device layer having etched pattern with a circuit chip, wherein a plurality of bottoms of the bases and the bottom of sealing ring are connected to a plurality of metal bonding areas of the circuit chip;
  removing part of the handle layer and insulating layer to from at least one sensing element, a plurality of bases, a plurality of springs and a sealing ring; and
  fixing a conductive lid to the end surface of the sealing ring, so as to form a hermetic chamber surrounding the at least one sensing element and an active surface of the circuit chip.

Another embodiment discloses a method for fabricating an apparatus integrating a microelectromechanical system device with a circuit chip, which comprises the steps of:
  providing an SOI (Silicon on Insulator) wafer, wherein the SOI wafer comprises a device layer, an insulating layer and a handle layer stacked in order;
  etching from the device layer through the insulating layer so as to form a plurality of ring grooves and a plurality of pillars disposed at the center of the ring grooves;
  forming a plurality of first holes at the center of each of the pillars and outside of the pillars, wherein the first holes penetrate the insulating layer and are filled with the conductive material;
  etching the surface of the device layer so as to form a bottom of sealing ring, a plurality of bottoms of a plurality of supporting bases and a plurality of bottoms of a plurality of bases;
  etching the device layer to the insulating layer so as to form an etched pattern;
  integrating the above-mentioned device layer having etched pattern with a circuit chip, wherein the bottom of the sealing ring, the bottoms of the bases and the bottoms of the supporting bases are connected to a plurality of metal bonding areas of the circuit chip;
  forming a plurality of second holes on the handle layer;
  removing the insulating layer disposed above the device layer to form at least one sensing element, a plurality of springs, a sealing ring, the bases and the supporting bases; and
  covering an isolation layer on a surface of the handle layer so as to form a hermetic chamber surrounding the at least one sensing element and an active surface of the circuit chip.

The foregoing has outlined rather broadly the features of the disclosure in order that the detailed description that follows may be better understood. Additional features of the disclosure will be described hereinafter, and form the subject of the claims. It should be appreciated by those skilled in the art that the conception and specific embodiment disclosed may be readily utilized as a basis for modifying or designing other structures or processes for carrying out the same purposes of the disclosure. It should also be realized by those skilled in the art that such equivalent constructions do not depart from the spirit and scope of the disclosure as set forth in the appended claims.

DETAILED DESCRIPTION OF THE INVENTION

All embodiments disclose an apparatus integrating a microelectromechanical system device with a circuit chip, which utilizes an SOI (Silicon on Insulator) wafer and a wafer-to-wafer bonding process, so that the microelectromechanical system device can be vertically integrated with the circuit chip by a simplified process. That is, the improvements of structure not only result in an increase in the number of electrical interconnection between the microelectromechanical system device and the circuit chip, but also provide more flexibility for electrical interconnection design. Moreover, in the embodiment, a lid of the integrated apparatus can provide an electromagnetic interference shielding, thereby preventing the signal of the microelectromechanical system device from distortion.

Figure 1:
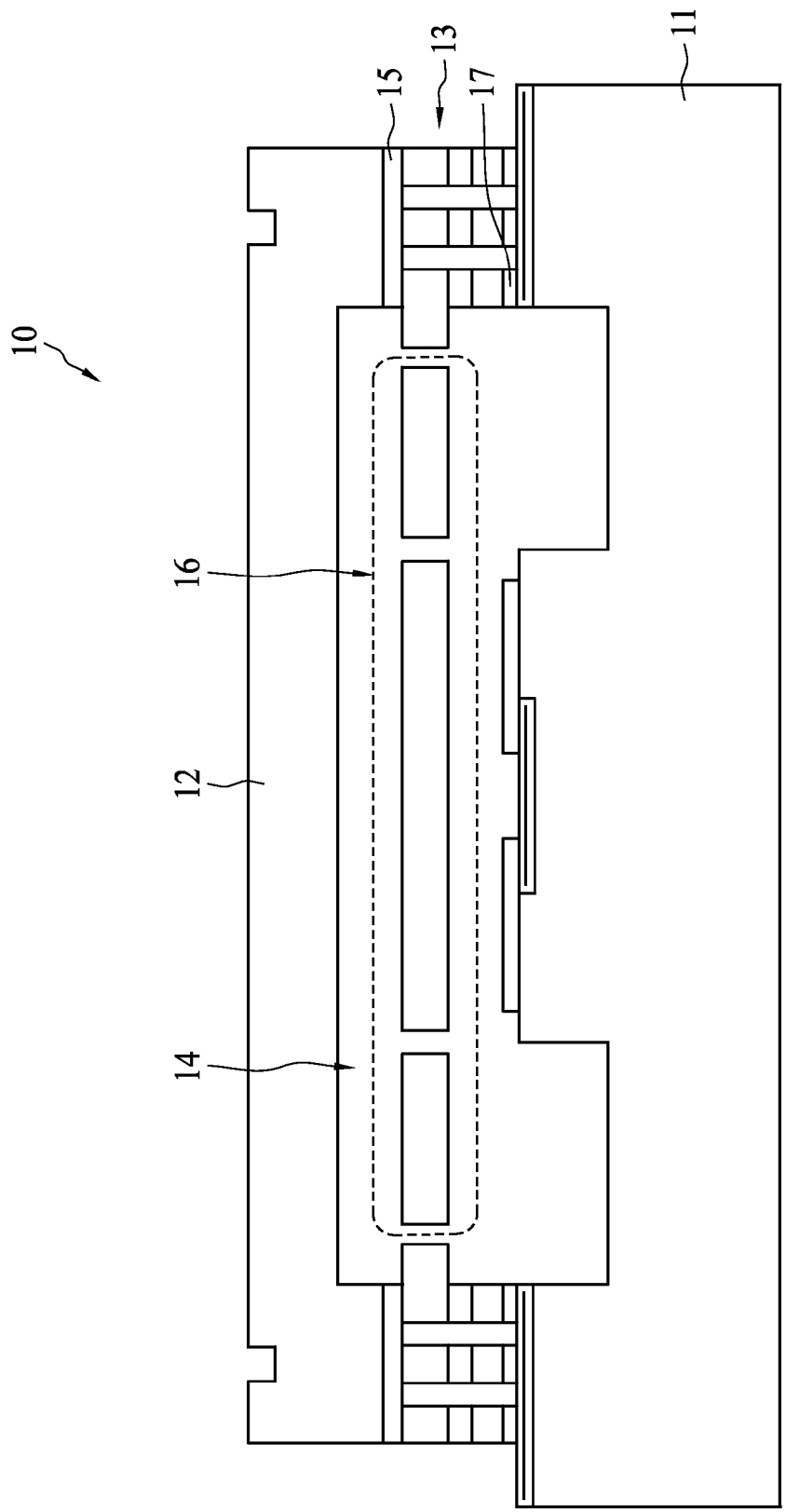
FIG. 1 is a cross-sectional view of U.S. Pat. No. 7,104,129.
Figure 2:
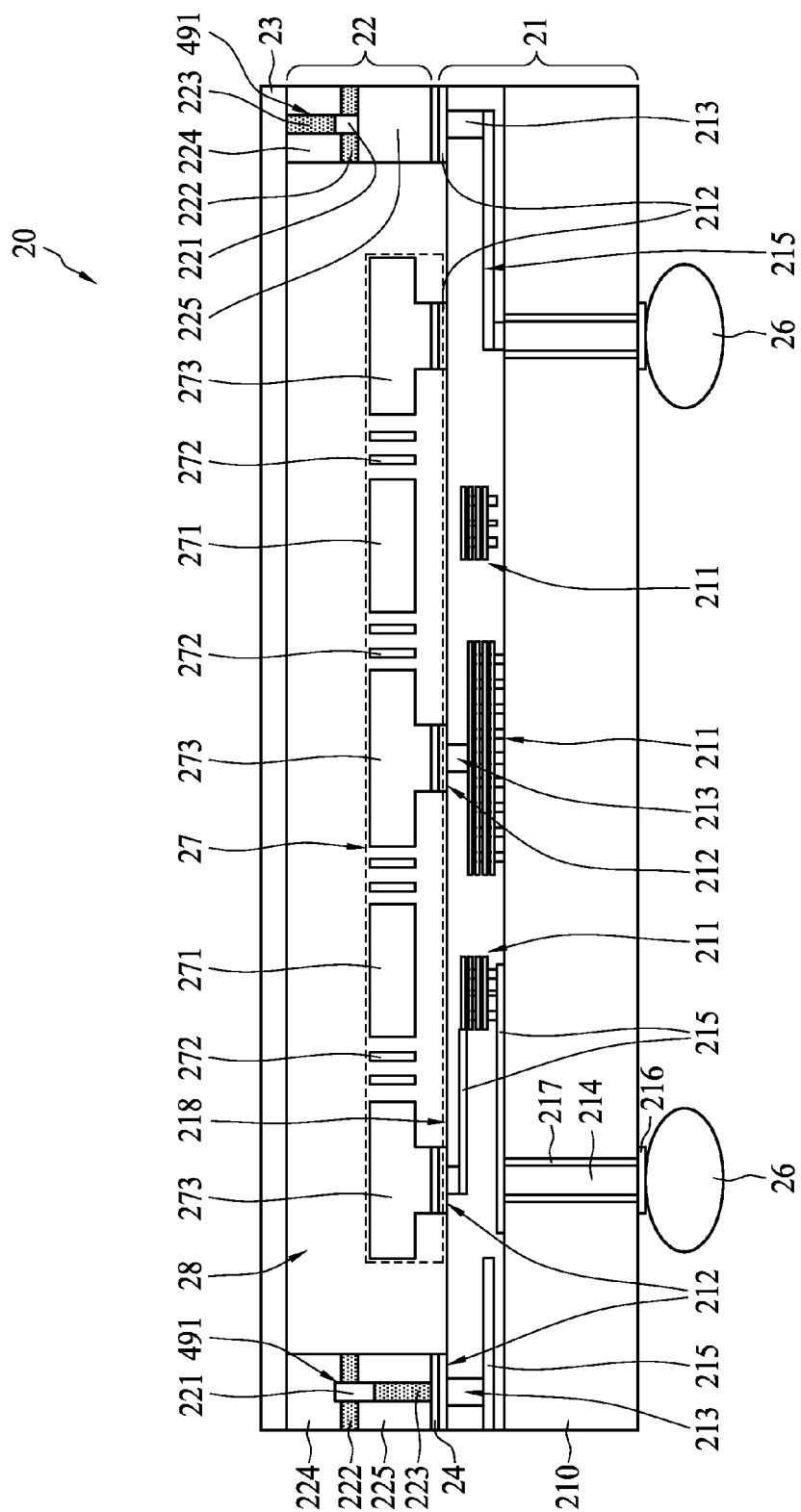
FIG. 2 is a cross-sectional view of an apparatus integrating a microelectromechanical system device with a circuit chip according to an embodiment.

FIG. 2 is a cross-sectional view of an apparatus integrating a microelectromechanical system device with a circuit chip according to an embodiment. An apparatus 20 integrating a microelectromechanical system device with a circuit chip comprises a circuit chip 21, a microelectromechanical system device 27, a sealing ring 22 and a metal lid 23. The circuit chip 21 comprises a substrate 210 and a plurality of metal bonding areas 212, the substrate 210 has an active surface 218 with an electrical circuit area 211, and the metal bonding areas 212 are disposed on the active surface 218 and electrically connected to the electrical circuit area 211. Each one of the plurality of the metal bonding areas 212 is respectively electrically connected to at least one conductive trace 215 by a first vertical metal pillars 213. At least one of the conductive trace 215 is respectively electrically connected to at least one conductive pad 216 by a second vertical metal pillar 214. The solder balls 26 are disposed on a surface of the conductive pads 216. The solder balls 26 are used as an external electrical contact of the integrated apparatus 20. Moreover, the vertical metal pillars 214 and the substrate 210 are spaced apart from each other by an insulating material 217.

The microelectromechanical system device 27 comprises a plurality of bases 273 and at least one sensing element 271, and each one of the bases 273 is connected to one of the metal bonding areas 212. The at least one sensing element 271 is elastically connected to the bases 273. In the embodiment, the at least one sensing element 271 is elastically and electrically connected to the bases 273 by a plurality of springs 272. However, the elastic connection of the disclosure is not limited to the spring in the embodiment; the elastic connection can also be formed by other elastic devices.

The sealing ring 22 surrounds the bases 273, and is connected to at least one of the metal bonding areas 212. Depending on design requirements, the bases 273 can be disposed at the center, the periphery of the active surface 218 of the circuit chip 21 or the other location of the active surface 218 of the circuit chip 21, and connected to at least one of the metal bonding areas 212. The metal lid 23 is opposite to the active surface 218 of the circuit chip 21, and connected to the sealing ring 22 so as to form a hermetic chamber 28 which seals the microelectromechanical system device 27.

The sealing ring 22 is formed by etching an SOI (Silicon on Insulator) chip, which comprises an insulating layer 222, two silicon layers 224, 225 clipping the insulating layer 222 and a plurality of conductive pillars 221 penetrating the insulating layer 222. In the blind hole 491 filled with the conductive pillar 221, an insulating material 223 can further be filled to the blind hole 491; however, the blind hole 491 can also be completely filled by the conductive pillar 221 (not shown). The two silicon layers 224, 225 of the sealing ring 22 are electrically connected by the conductive pillar 221; that is, the metal lid 23 made of metal or a conductive material is electrically connected to one of the metal bonding areas 212 by the electrical path through the two silicon layers 224, 225 of the sealing ring 22, the conductive pillar 221, and the conductive bonding material 24. And the metal bonding area 212 can be electrically connected to a ground conductive layer (not shown). Because the metal lid 23 is made of conductive material, after being connected to the ground conductive layer, an electromagnetic interference shielding is formed. Therefore, the signal of the microelectromechanical system device 27 and the circuit chip 21 is shielded from electromagnetic interference, thereby improving signal stability of the integrated apparatus.

Figure 3:
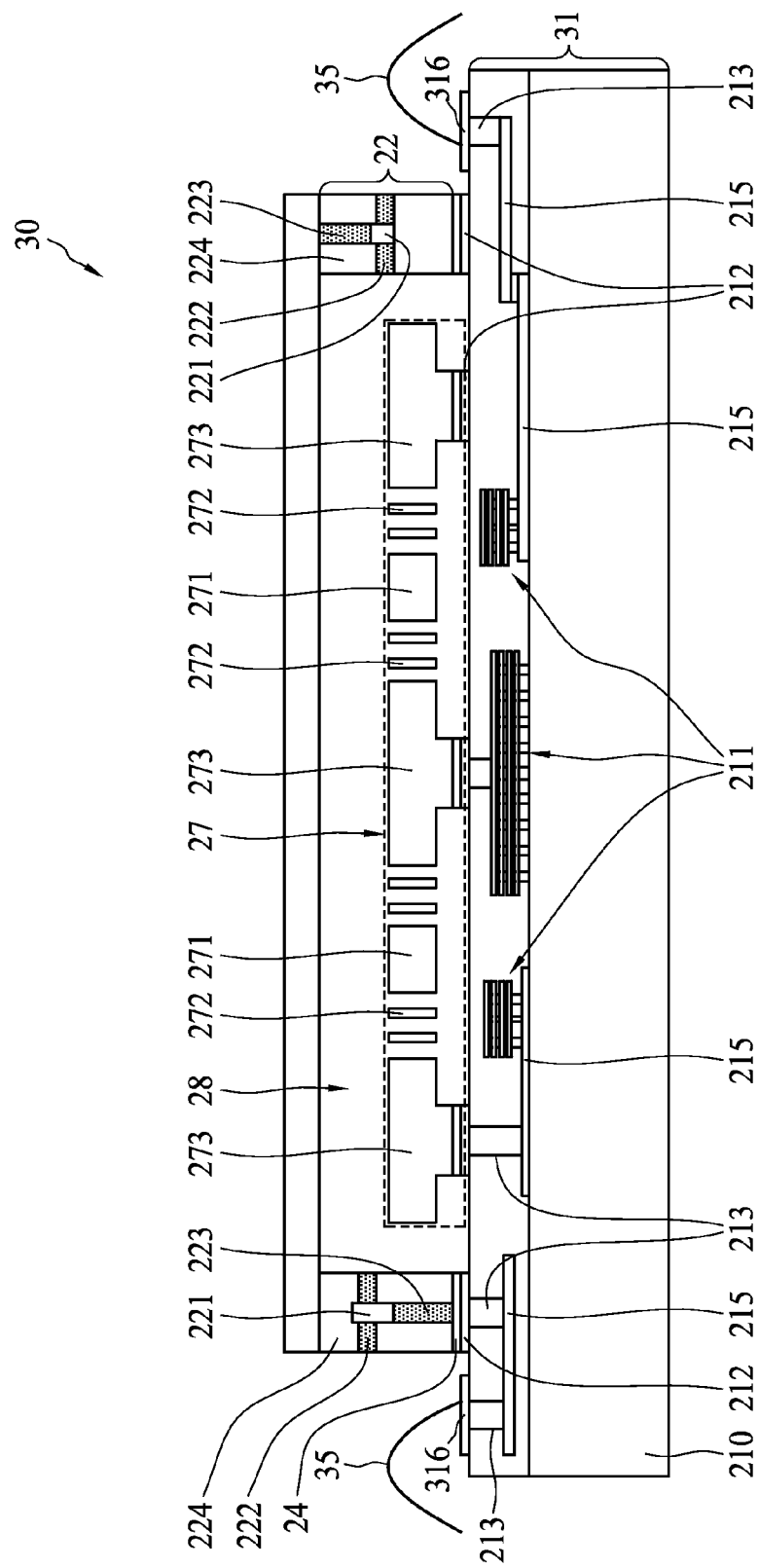
FIG. 3 is a cross-sectional view of an apparatus integrating a microelectromechanical system device with a circuit chip according to an embodiment.

FIG. 3 is a cross-sectional view of an apparatus integrating a microelectromechanical system device with a circuit chip according to an embodiment of the disclosure. In comparison with FIG. 2, a plurality of conductive pads 316 are further disposed at the periphery of the active surface 218 of the circuit chip 31 of the apparatus 30 in FIG. 3. The conductive pads can also be disposed on a passive surface of the substrate opposite to the active surface. The electrical circuit area can be electrically connected to the conductive pads 316 by the electrical path through conductive trace 215 and the vertical metal pillars 213. By a plurality of metal wires 35, the conductive pads 316 can be electrically connected to another printed circuit board (not shown) or external system circuit. Moreover, the at least one conductive pads 316 can also be electrically connected to the metal lid 23 by the electrical path from the vertical metal pillars 213, through the conductive trace 215, vertical metal pillars 213, the metal bonding area 212, two silicon layers 224, 225 of the sealing ring 22 and the conductive pillar 221. And at the same time, the conductive pads 316 can be connected to the external ground conductive layer (not shown) by the metal wire 35.

Figure 4A:
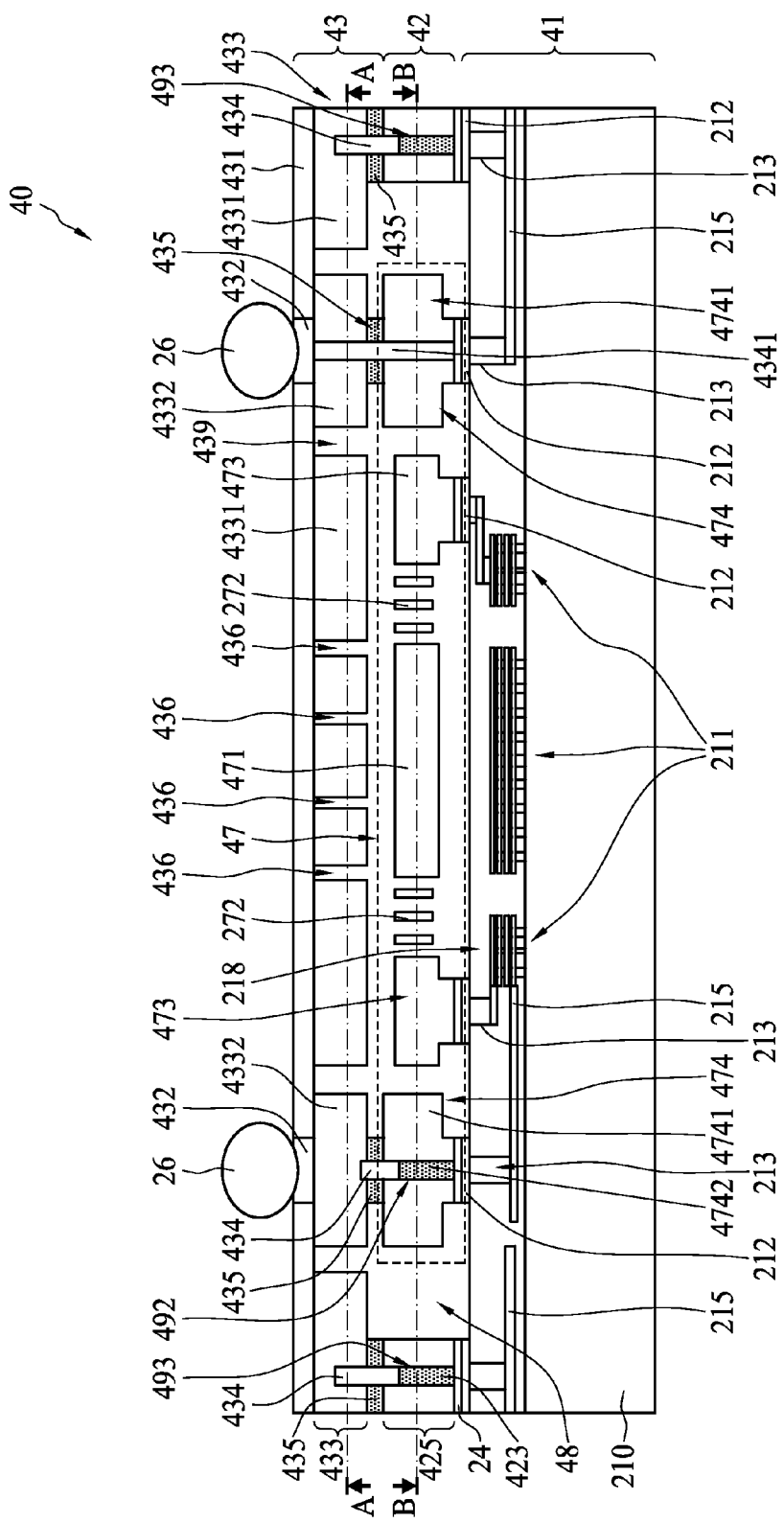
FIG. 4A is a cross-sectional view of an apparatus integrating a microelectromechanical system device with a circuit chip according to an embodiment.

FIG. 4A is a cross-sectional view of an apparatus integrating a microelectromechanical system device with a circuit chip according to an embodiment. An apparatus 40 integrating a microelectromechanical system device with a circuit chip comprises a circuit chip 41, a microelectromechanical system device 47, a sealing ring 42 and a lid 43.

The microelectromechanical system device 47 comprises a plurality of bases 473, a plurality of supporting bases 474 and a sensing element 471. Each one of the bases 473 and each of the supporting bases 474 are connected to the metal bonding areas 212 respectively. The sensing element 471 can be elastically and electrically connected to either the bases 473 or the supporting bases 474. In FIG. 4A, one of the sensing elements 471 is elastically and electrically connected to the bases 473 by a plurality of springs 272. The supporting bases 474 comprise a first silicon layer 4741, and each of the supporting bases 474 has a via 492. And a portion of the at least one of the via is filled with an insulating material 4742.

The lid 43 comprises an insulating layer 435, a second silicon layer 433, an isolation layer 431 and a plurality of conductive pillars 434 penetrating the insulating layer 435. The conductive pillar 434 electrically connects the first silicon layer 425 and the second silicon layer 433. The first silicon layer 425 and the second silicon layer 433 clip the insulating layer 435. The conductive pillar 434 can electrically connect the island section 4332 of the second silicon layer 433 of the lid 43 and the supporting base 474 to from an electrical path from the conductive pads 432 to the metal bonding areas 212 as shown in left side of FIG. 4A. The sensing elements 471, however, can also be elastically and electrically connected to the supporting base 474 by a plurality of springs 272 although it is not shown in the FIG. 4A. The isolation layer 431 is disposed on an upper surface of the second silicon layer 433, so as to form an insulating protective layer, and can seal the first opening of the second holes 436 and an ring air gap 439 of the second silicon layer 433. The isolation layer 431 is embedded with a plurality of conductive pads 432, and a plurality of solder balls 26 used as external electrical contacts are fixed on the conductive pads 432. Moreover, the conductive pillar 4341 can also penetrate the island section 4332 of the second silicon layer 433 of the lid 43, insulating layer 435 and the supporting base 474 to from an electrical path from the conductive pads 432 to the metal bonding areas 212 as shown in right side of FIG. 4A.

After the conductive pillar 4341 penetrates the island section 4332 of the second silicon layer 433 of the lid 43, the insulating layer 435 and the supporting base 474, the at least one of the sensing elements 471 can also be elastically and electrically connected to the supporting bases 474 with the conductive pillar 4341 by a plurality of springs 272, so as to form a electrical path from the sensing elements 471 to the conductive pads 432 and solder balls 26 that is used as external electrical contacts.

The supporting bases 474, the bases 473 and the sealing ring 42 are connected to the metal bonding areas 212 by a conductive bonding material respectively. The sealing ring 42 surrounds the edge of the circuit chip 41, and is connected to at least one of the metal bonding areas 212. The lid 43 is opposite to the active surface 218 of the circuit chip 41, and connected to the sealing ring 42 so as to form a hermetic chamber 48 which seals the microelectromechanical system device 47, thereby sealing and protecting the sensing structure. The sealing ring 42 comprises a first silicon layer 425 and the insulating material 423 filled in a via 493 of the first silicon layer 425. The conductive pillar 434 of the lid 43 penetrates the insulating layer 435, and electrically connects the second silicon layer 433 of the lid 43 and the first silicon layer 425 of the sealing ring 42, thereby allowing the second silicon layer 433 of the lid 43 to be electrically connected to the metal bonding area 212 disposed below the sealing ring 42. When the metal bonding area 212 is connected to the ground conductive layer (not shown), the second silicon layer 433 of the lid 43 can perform an electromagnetic interference shielding.

Figure 4B:
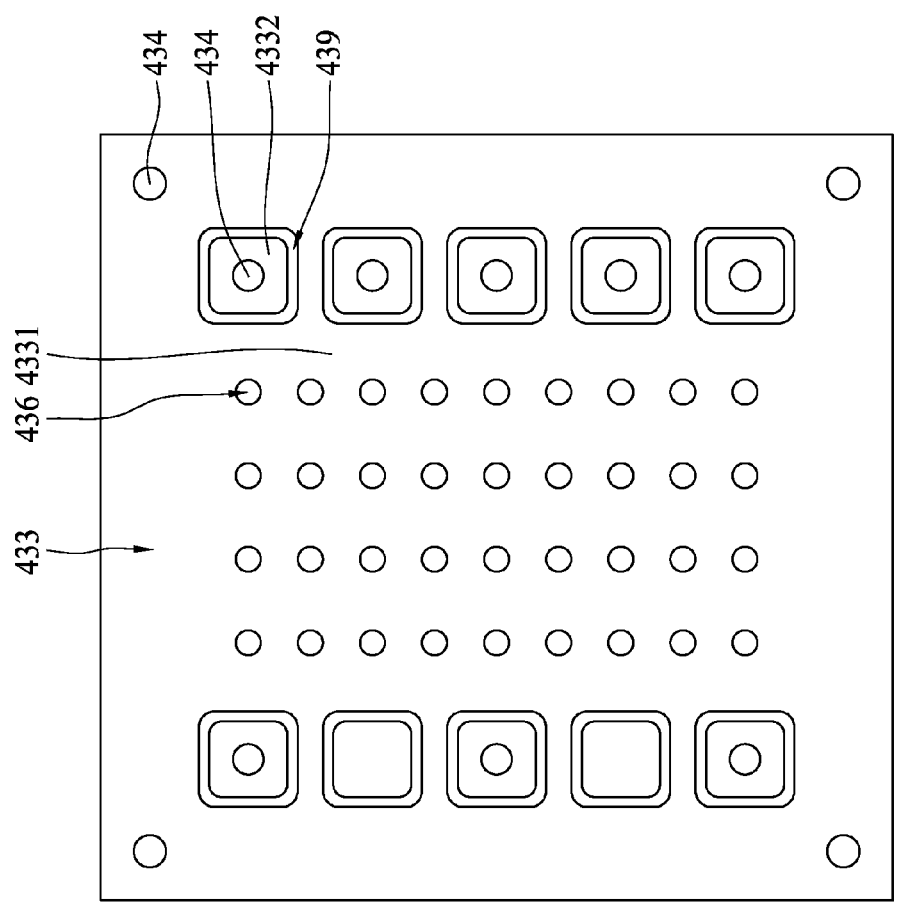
FIG. 4B is a cross-sectional view along a cross-sectional line A-A in FIG. 4A.

FIG. 4B is a cross-sectional view along a cross-sectional line A-A in FIG. 4A. The second silicon layer 433 of the lid 43 comprises a foundation 4331 and a plurality of island sections 4332, and the island sections 4332 and the foundation 4331 are electrically insulated from each other by the ring air gap 439 disposed therebetween. There are a plurality of the second holes 436 in the foundation 4331, which provides a channel for etchant to flow during an etching process. Referring to FIG. 4A again, it is understood that the solder balls 26 shown on the left of the figure can be connected electrically to one of the electrical circuit area 211 of the circuit chip 41 through the island section 4332, the conductive pillar 434, the supporting base 474, the vertical metal pillars 213 and conductive trace 215 (detailed electrically connecting path is shown by the reference numbers in the figure). The solder balls 26 shown on the right of the figure can be connected electrically to the foundation 4331 of the lid 43 through the island section 4332, the conductive pillar 4341, the supporting base 474, the vertical metal pillars 213, conductive trace 215, first silicon layer 425 and conductive pillar 434 (detailed electrically connecting path is shown by the reference numbers in the figure).

Figure 4C:
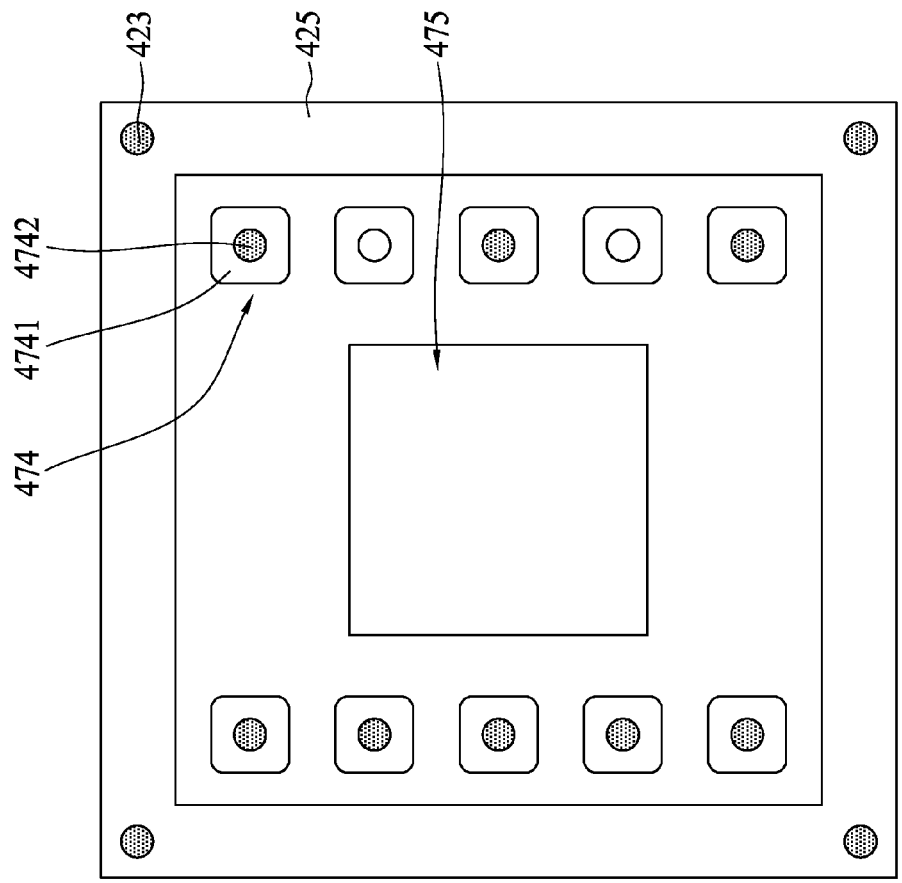
FIG. 4C is a cross-sectional view along a cross-sectional line B-B in FIG. 4A.

FIG. 4C is a cross-sectional view along a cross-sectional line B-B in FIG. 4A. The first silicon layer 425 of the sealing ring 42 surrounds the edge of the circuit chip 41, and there are portions of vias 493 filled by an insulating material 423 at four corners. The sensing element 471 and bases 473 of microelectromechanical system device 47 (they are simplified as a block 475 in the figure) are disposed at the center, and the sensing element 471 may be an accelerometer, an angular rate sensor, an oscillator and so on. In this cross-sectional view along a cross-sectional line B-B in FIG. 4A, there is a plurality of supporting bases 474, and the insulating material 4742 also fill the portions of via 492 disposed at the center of each of the supporting bases 474.

Figure 5:
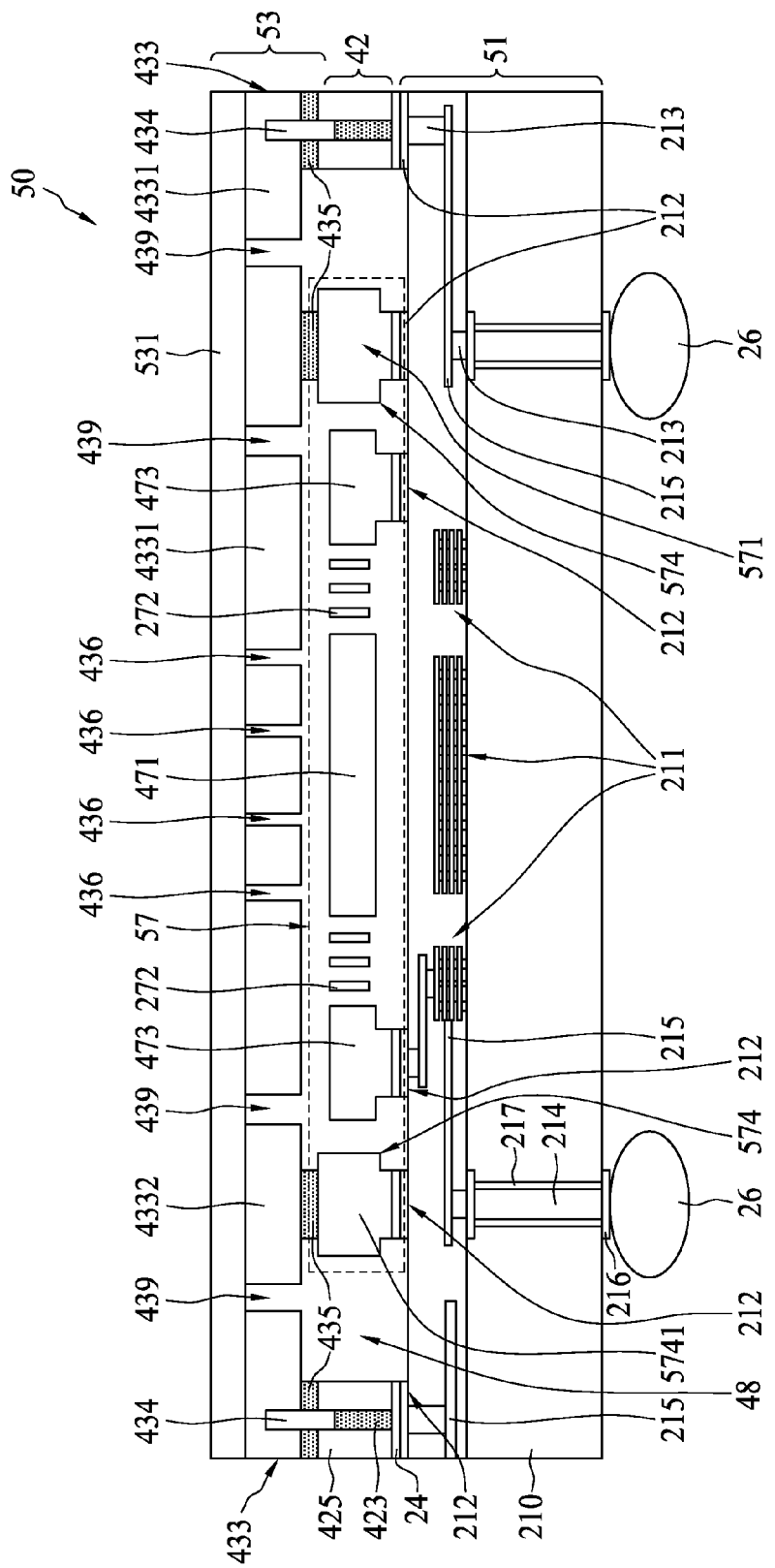
FIG. 5 is a cross-sectional view of an apparatus integrating a microelectromechanical system device with a circuit chip according to an embodiment.

FIG. 5 is a cross-sectional view of an apparatus integrating a microelectromechanical system device with a circuit chip according to an embodiment of the disclosure. An apparatus 50 integrating a microelectromechanical system device with a circuit chip comprises a circuit chip 51, a microelectromechanical system device 57, a sealing ring 42 and a lid 53.

The microelectromechanical system device 57 comprises a plurality of bases 473, a plurality of supporting bases 574 and at least one sensing element 471, and the bases 473. The supporting bases 574 are respectively connected to at least one of the metal bonding areas 212. In the embodiment, the supporting bases 574 comprise a first silicon layer 5741. In comparison with FIG. 4A, the supporting bases 574 cannot be electrically connected to the island section 4332 of the lid 53 because of the insulating layer 435 disposed therebetween, and also cannot be electrically connected to the electrical circuit area 211 of the circuit chip 51 by the metal bonding area 212.

The lid 53 comprises an insulating layer 435, a second silicon layer 433, an isolation layer 531 and a plurality of conductive pillars 434 penetrating the insulating layer 435. The conductive pillar 434 electrically connects the first silicon layer 425 and the second silicon layer 433, and the first silicon layer 425 and the second silicon layer 433 clip the insulating layer 435. The isolation layer 531 is disposed on the upper surface of the second silicon layer 433, so as to form an insulating protective layer, and can seal the first opening of a second hole 436 and an ring air gap 439 of the second silicon layer 433, so as to form a hermetic structure layer.

Figure 6:
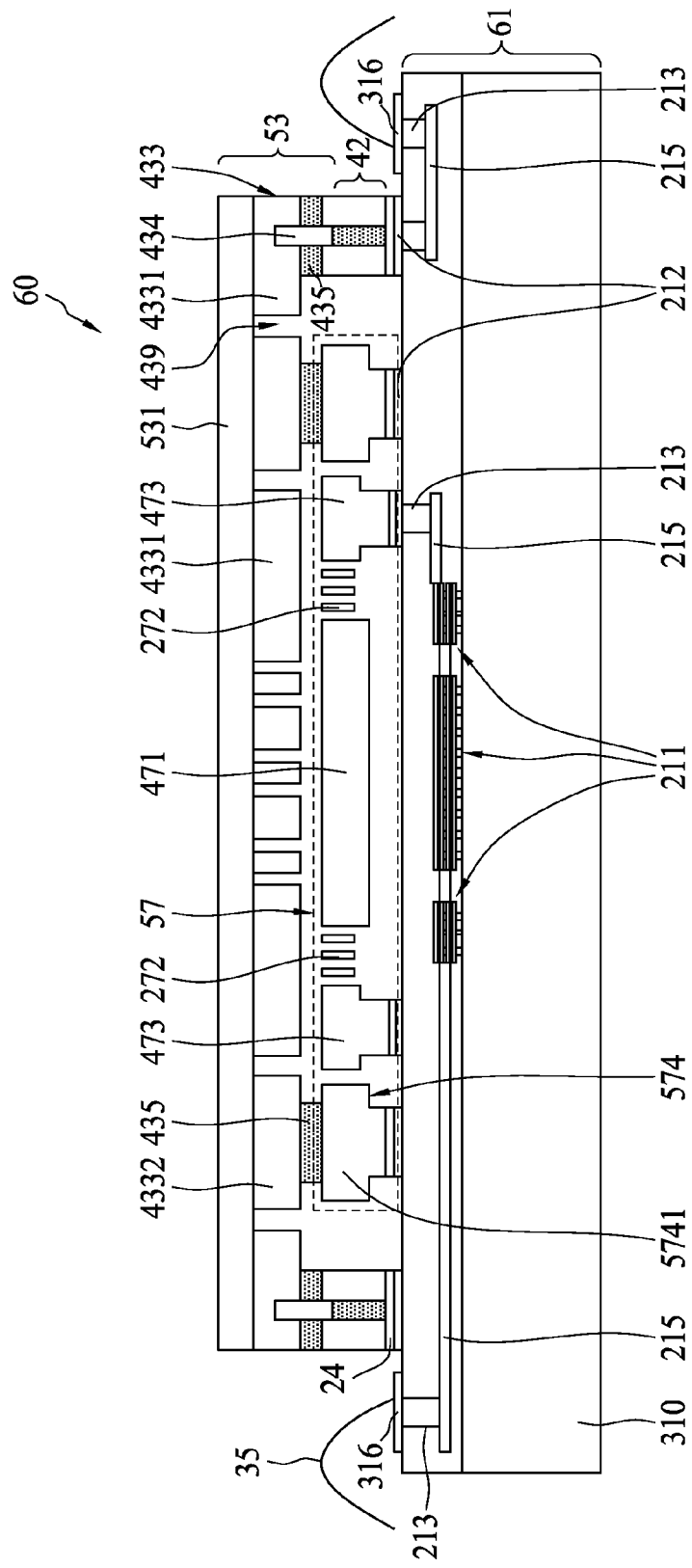
FIG. 6 is a cross-sectional view of an apparatus integrating a microelectromechanical system device with a circuit chip according to an embodiment.

FIG. 6 is a cross-sectional view of an apparatus integrating a microelectromechanical system device with a circuit chip according to an embodiment of the disclosure. An apparatus 60 integrating a microelectromechanical system device with a circuit chip comprises a circuit chip 61, a microelectromechanical system device 57, a sealing ring 42 and a lid 53. In comparison with FIG. 5, a plurality of conductive pads 316 are further disposed at the periphery of the active surface 218 of the circuit chip 61 of the integrated apparatus 60 in FIG. 6. By a plurality of metal wires 35, the conductive pads 316 can be electrically connected to another printed circuit board (not shown) or external system circuit. The conductive pads 316 can also be electrically connected to the lid 53 by the vertical metal pillars 213, the conductive trace 215, the sealing ring 42 and the conductive pillar 434.

Figure 7A:
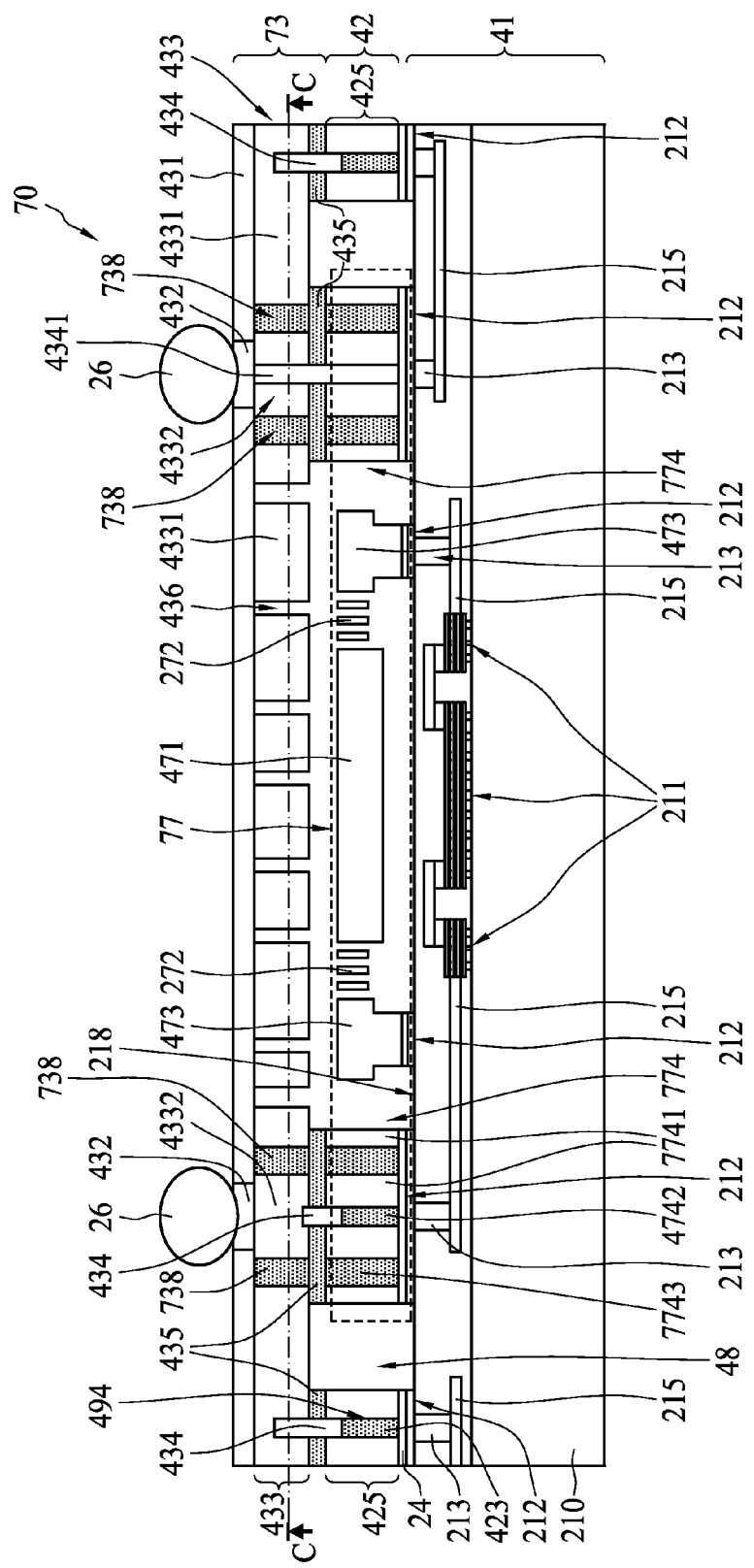
FIG. 7A is a cross-sectional view of an apparatus integrating a microelectromechanical system device with a circuit chip according to an embodiment.

FIG. 7A is a cross-sectional view of an apparatus integrating a microelectromechanical system device with a circuit chip according to an embodiment of the disclosure. An apparatus 70 integrating a microelectromechanical system device with a circuit chip comprises a circuit chip 41, a microelectromechanical system device 77, a sealing ring 42 and a lid 73.

The microelectromechanical system device 77 comprises a plurality of bases 473, a plurality of supporting bases 774 and at least one sensing element 471. Each one of the bases 473 and each one of the supporting bases 774 are connected to the metal bonding areas 212 respectively. The sensing element 471 is respectively elastically connected to the bases 473. In the embodiment, one of the sensing elements 271 is elastically connected to the bases 473 by a plurality of springs 272. The supporting bases 774 comprise a first silicon layer 7741, and each of the supporting bases 774 has a via filled with the insulating material 4742. The first silicon layer 7741 of each of the supporting bases 774 has a first ring insulating wall 7743 and the first ring insulating wall 7743 surrounds the insulating material 4742 disposed at the center of the supporting bases 774. Each of the first ring insulating walls 7743 penetrates the first silicon layer 7741 of the supporting base 774. The lid 73 comprises an insulating layer 435, a second silicon layer 433, an isolation layer 431, a plurality of second ring insulating walls 738 which are annular and a plurality of conductive pillars 434 penetrating the insulating layer 435. The conductive pillar 434 of the lid 73 connects the first silicon layer 425 of the sealing ring 42 and the second silicon layer 433 of the lid 73, and the first silicon layer 425 of the sealing ring 42 and the second silicon layer 433 of the lid 73 clip the insulating layer 435. The isolation layer 431 is disposed on the upper surface of the second silicon layer 433, so as to form an insulating protective layer, and can seal the first opening of the second holes 436 of the second silicon layer 433 of the lid 73. The second ring insulating wall 738 of the lid 73 which corresponds to the first ring insulating wall 7743 of the supporting base 774 is disposed above the first ring insulating wall 7743 of the supporting base 774. And the insulating layer 435 is disposed between the first ring insulating wall 7743 of the supporting base 774 and the second ring insulating wall 738 of the lid 73. The isolation layer 431 is embedded with a plurality of conductive pads 432. And a plurality of solder balls 26 used as external electrical contacts are fixed on the conductive pads 432. Moreover, the conductive pillar 4341 (as shown in right side of FIG. 7A) can also penetrate the first silicon layer 7741 of the supporting base 774, the insulating layer 435 disposed between the supporting base and the island section and the second silicon layer 4332 of the lid 73 to form an electrical path from the metal bonding areas 212 of the circuit chip 41 to the conductive pads 432 of the lid 73.

The sealing ring 42 surrounds the edge of the circuit chip 41, and is connected to at least one of the metal bonding areas 212. The lid 73 is opposite to the active surface 218 of the circuit chip 21, and is connected to the sealing ring 42 so as to form a hermetic chamber 48 which seals the sensing element 471 and the electrical circuit areas 211. The sealing ring 42 comprises a first silicon layer 425 and the via 494 of the first silicon layer 425 filled with the insulating material 423. The conductive pillar 434 of the lid 73 penetrates the insulating layer 435 to electrically connect the second silicon layer 433 of the lid 73 and the first silicon layer 425 of the sealing ring 42. Then the second silicon layer 433 of the lid 43 can be electrically connected to the metal bonding area 212 disposed below the sealing ring 42. When the second silicon layer 433 of the lid 43 is electrically connected to the metal bonding area 212 and the metal bonding area 212 is connected to the ground conductive layer (not shown), the second silicon layer 433 of the lid 73 can perform as an electromagnetic interference shielding.

Figure 7B:
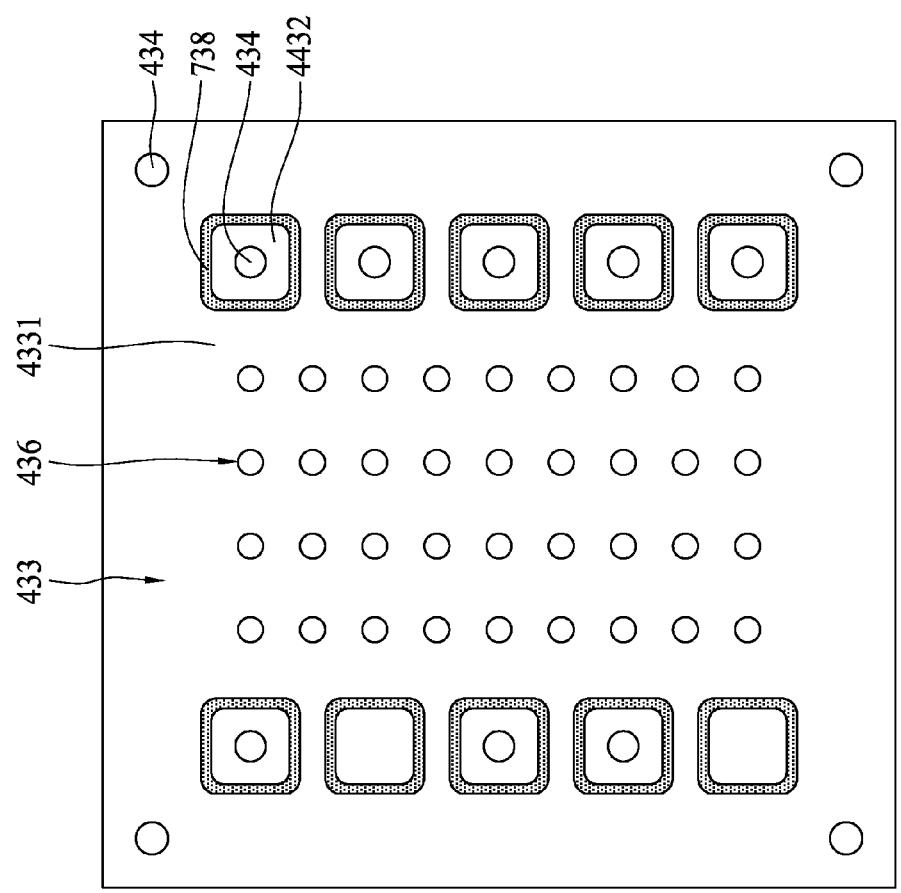
FIG. 7B is a cross-sectional view along a cross-sectional line C-C in FIG. 7A.

FIG. 7B is a cross-sectional view along a cross-sectional line C-C in FIG. 7A. The second silicon layer 433 of the lid 73 comprises a foundation 4331 and a plurality of island sections 4332, and the island sections 4332 and the foundation 4331 are electrically insulated from each other by the second ring insulating wall 738, which is disposed therebetween. There are a plurality of the second holes 436 in the foundation 4331, which provides a channel for etchant to flow during an etching process. Referring to FIG. 7A again, it is understood that the solder balls 26 shown on the left of the figure can be electrically connected to one of the electrical circuit area 211 of the circuit chip 41 by the island section 4332, the conductive pillar 434, the supporting base 774, first vertical metal pillars 213 and conductive trace 215 (detailed electrically connecting path is shown by the reference numbers in the figure). The solder balls 26 shown on the right of the figure can be connected to the second silicon layer 433 of the lid 73 by the island section 4332, the conductive pillar 4341, the supporting base 774, first vertical metal pillars 213, conductive trace 215, first silicon layer 425 of the sealing ring 42 and the conductive pillar 434 (detailed electrically connecting path is shown by the reference numbers in the figure). In comparison with the ring air gap 439 in FIG. 4B, in the embodiment as shown in FIG. 7B, the island section 4332 and the foundation 4331 are insulated from each other by the second ring insulating wall 738.

Figure 8:
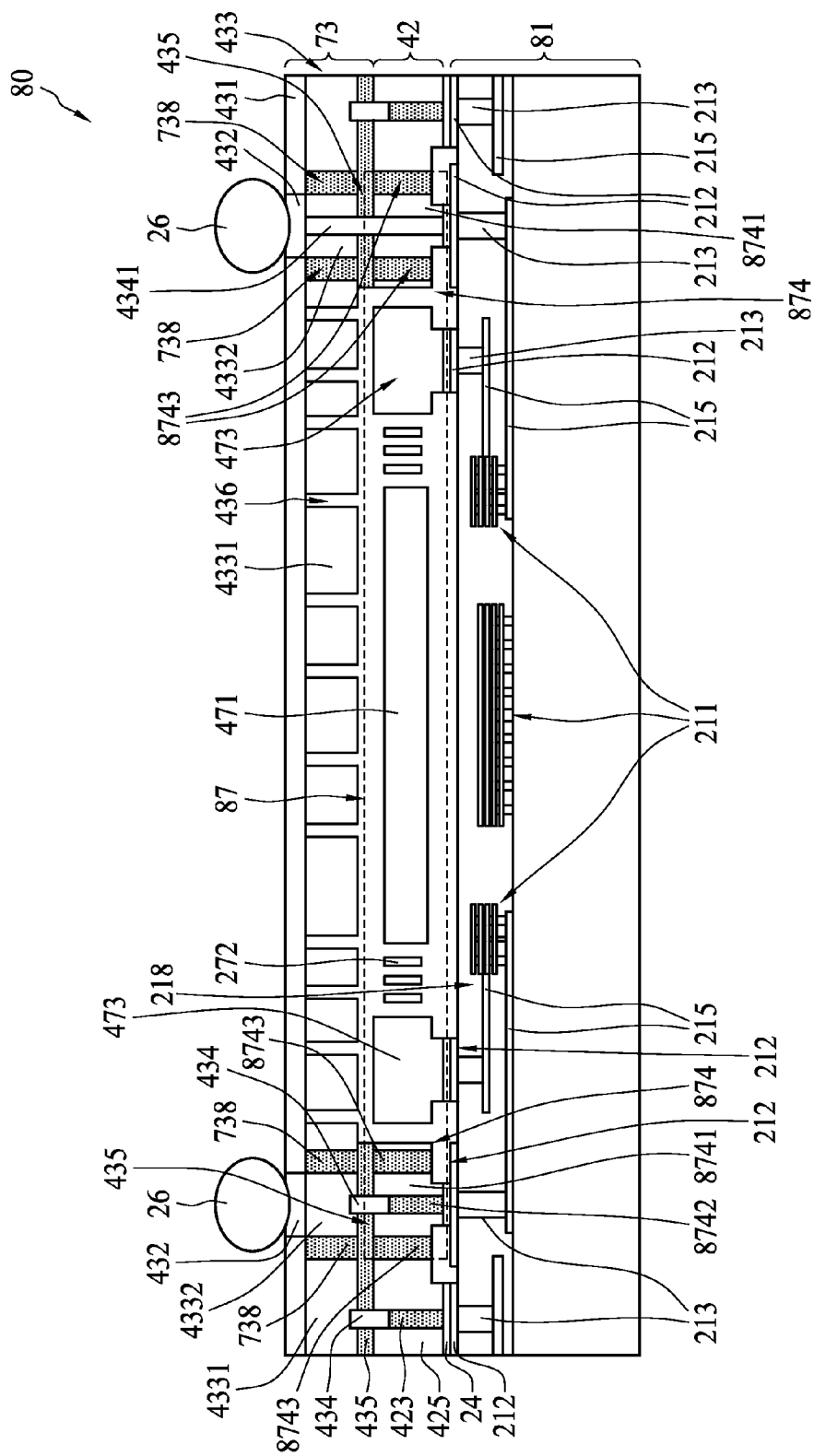
FIG. 8 is a cross-sectional view of an apparatus integrating a microelectromechanical system device with a circuit chip according to an embodiment.

FIG. 8 is a cross-sectional view of an apparatus integrating a microelectromechanical system device with a circuit chip according to an embodiment of the disclosure. An apparatus 80 integrating a microelectromechanical system device with a circuit chip comprises a circuit chip 81, a microelectromechanical system device 87, a sealing ring 42 and a lid 73.

The microelectromechanical system device 87 comprises a plurality of bases 473, a plurality of supporting bases 874 and at least one sensing element 471. Each one of the bases 473 and each one of the supporting bases 874 are connected to the metal bonding areas 212 respectively. The supporting bases 874 comprise a first silicon layer 8741. A first silicon layer 8741 of each of the supporting bases 874 has a first ring insulating wall 8743 and the first ring insulating wall 8743 surrounds the insulating material 8742 disposed at the center of the supporting bases 874. Each of the first ring insulating walls 8743 penetrates the first silicon layer 8741 of the supporting base 874. And each one of the supporting base 874 with the first ring insulating walls 8743 is embedded in the first silicon layer 425 of the sealing ring 42. In comparison with FIG. 7A, the sealing ring 42 of apparatus 70 and the supporting base 774 of apparatus 70 are separated by a space.

The lid 73 comprises an insulating layer 435, a second silicon layer 433, an isolation layer 431, a plurality of second ring insulating walls 738 and a plurality of conductive pillars 434 penetrating the insulating layer 435. The conductive pillar 434 electrically connects the first silicon layer 8741 of the supporting base 874 and the second silicon layer 433 of the lid 73, and the first silicon layer 8741 of the supporting base 874 and the second silicon layer 433 of the lid 73 clip the insulating layer 435. The isolation layer 431 is disposed on the upper surface of the second silicon layer 433 to form an insulating protective layer. And the isolation layer 431 can seal the first opening of the second holes 436 of the second silicon layer 433 to form a hermetic sealing layer. The second ring insulating wall 738 of the lid 73 which corresponds to the first ring insulating wall 8743 of the supporting base 874 is disposed above the first ring insulating wall 8743. The insulating layer 435 is disposed between the first ring insulating wall 8743 of the supporting base 874 and the second ring insulating wall 738 of the lid 73. The isolation layer 431 is embedded with a plurality of conductive pads 432. And a plurality of solder balls 26 used as external electrical contacts are fixed on the conductive pads 432. Moreover, the conductive pillar 4341 can also penetrate the second silicon layer 4332 of the lid 73, the insulating layer 435 and the first silicon layer 8741 of the supporting base 874 to form an electrical path from the conductive pads 432 of the lid 73 to the metal bonding areas 212 of the circuit chip 41.

Figure 9:
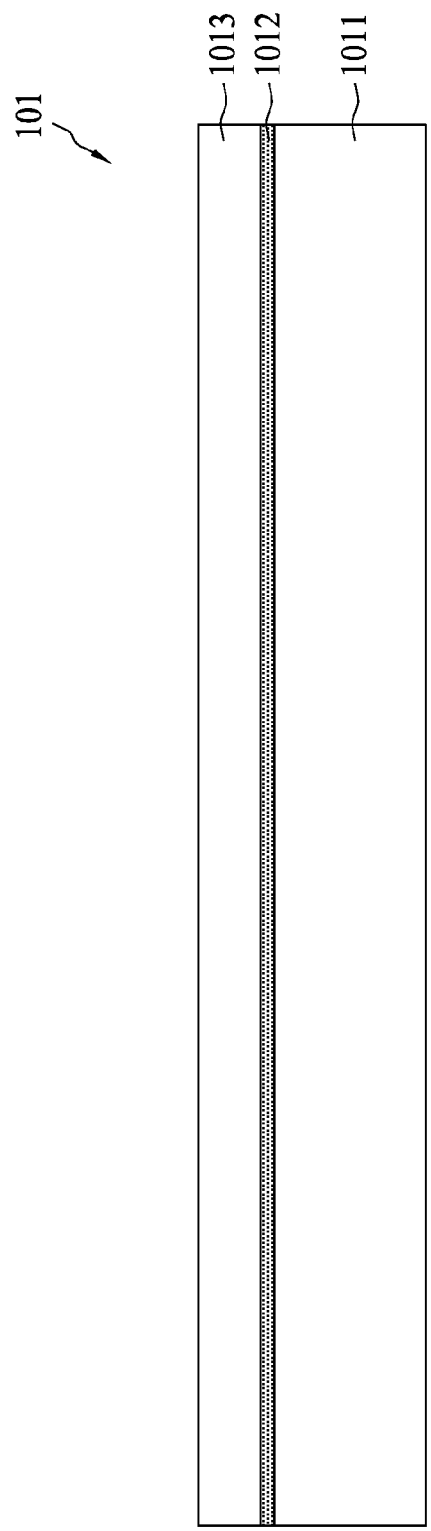
FIGS. 9 to 23 are schematic views of the fabricating steps of an integrated apparatus according to an embodiment.
Figure 10:
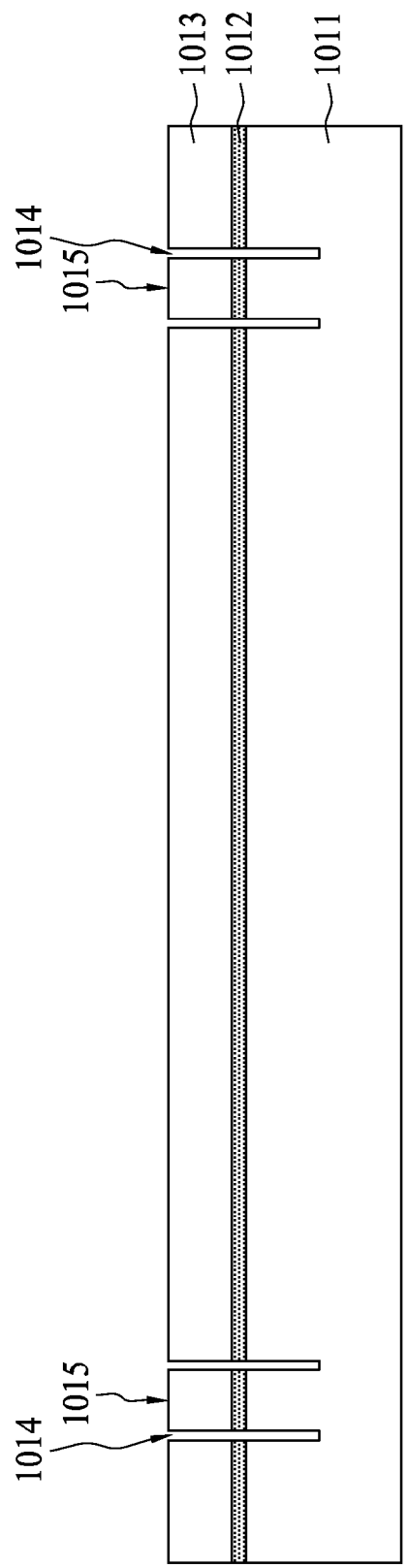

FIGS. 9 to 23 are schematic views of the fabricating steps of an integrated apparatus according to an embodiment of the disclosure. As shown in FIG. 9, an SOI (Silicon on Insulator) wafer 101 is provided. The SOI (Silicon on Insulator) wafer 101 comprises a device layer 1013, an insulating layer 1012 and a handle layer 1011 stacked in order. A plurality of ring grooves 1014 are formed, for example, by etching, on a surface of the device layer 1013, and each of the ring grooves 1014 has a pillar 1015 therein, as shown in FIG. 10.

Figure 11:
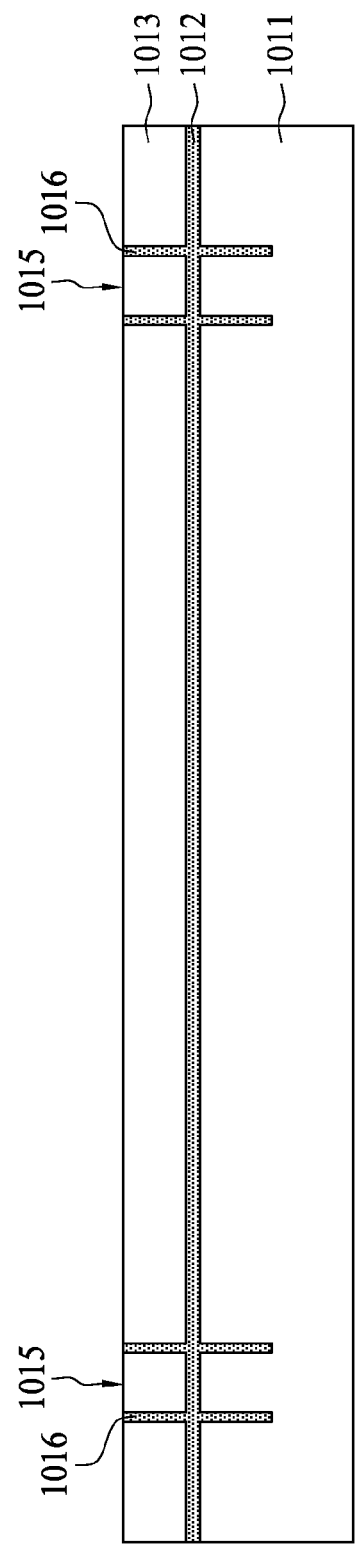
Figure 12:
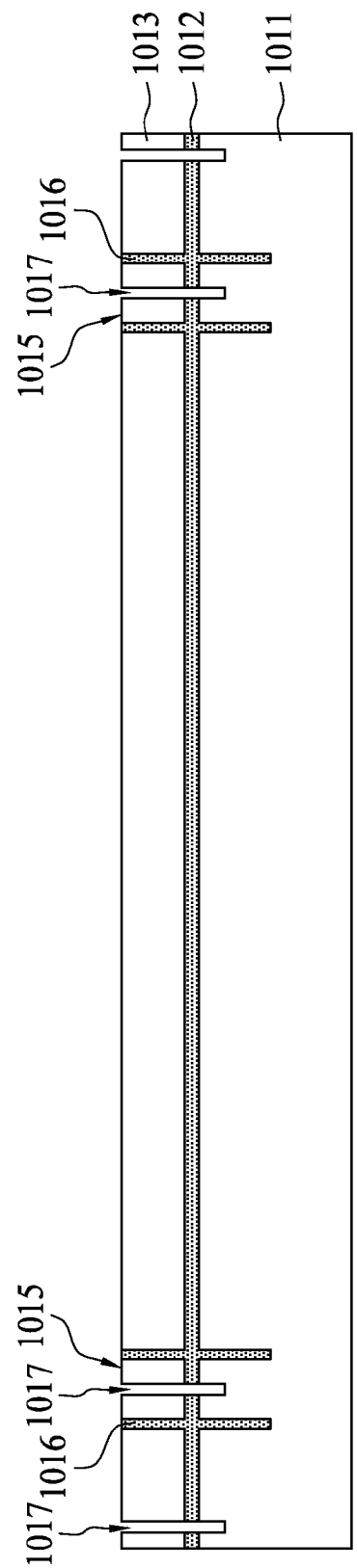
Figure 13:
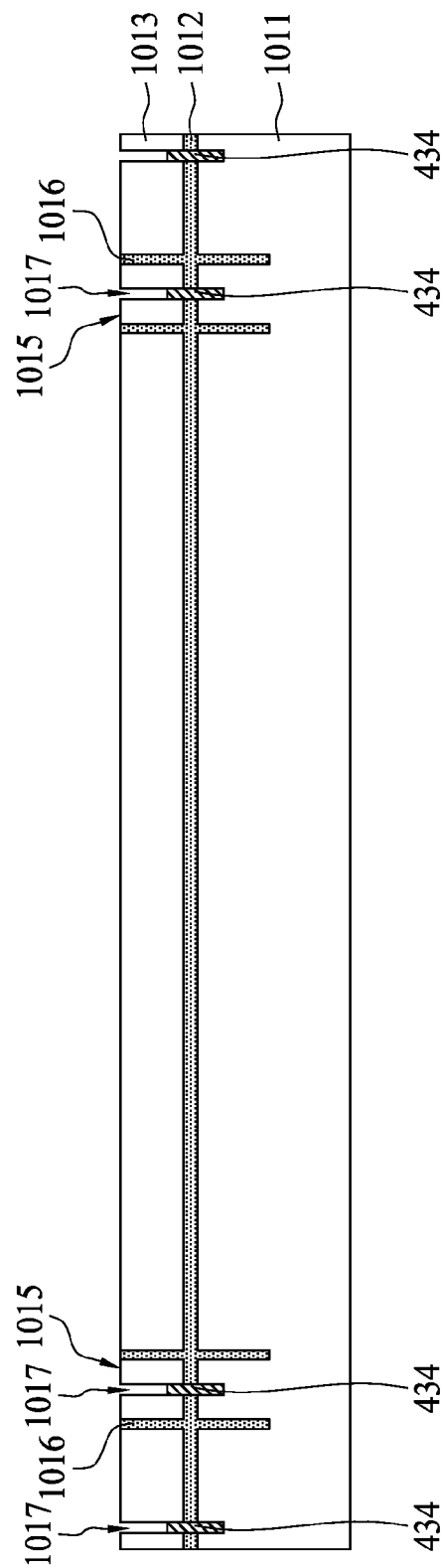
Figure 14:
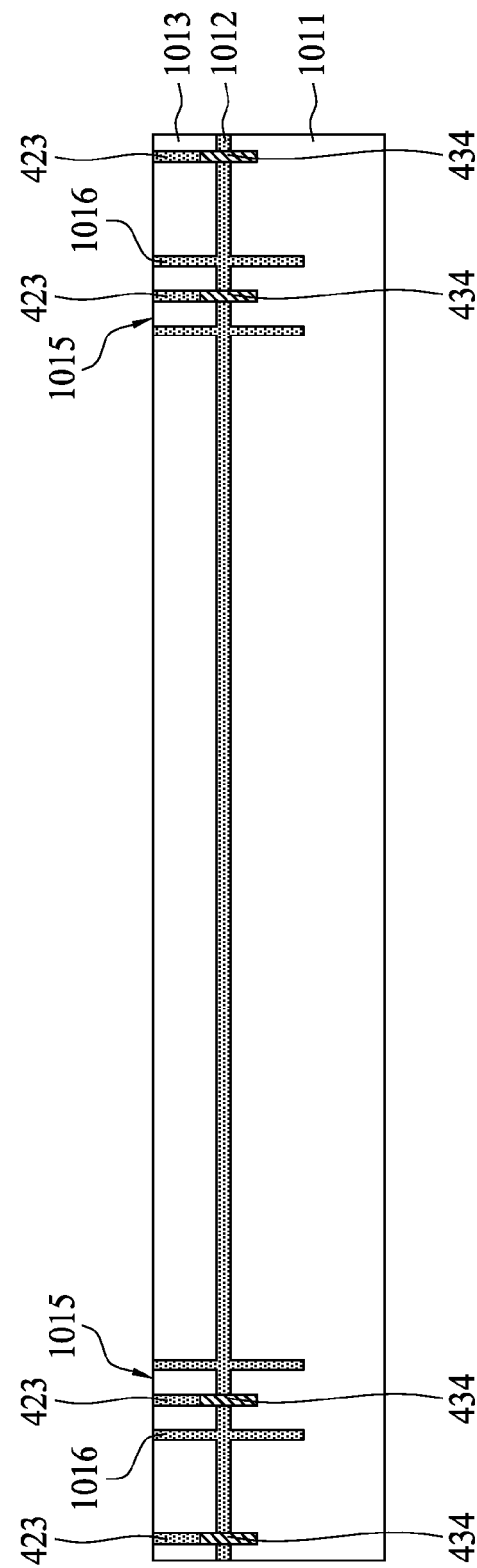

As shown in FIG. 11, an insulating material 1016, for example, silicon dioxide (SiO2) powder, is filled in the ring grooves 1014. Then, a plurality of first holes 1017 are formed, for example, by etching, in the pillars 1015 and in the location that is predetermined to form the sealing ring, as shown in FIG. 12. As shown in FIG. 13, a conductive pillar 434 is formed in each of the first holes 1017. And the material of the conductive pillar 434 may be poly-silicon and the height of the conductive pillar 434 is higher than that of the insulating layer 1012. As shown in FIG. 14, an insulating material 423, for example, silicon dioxide (SiO2) powder, is filled in each of the first holes 1017.

Figure 15:
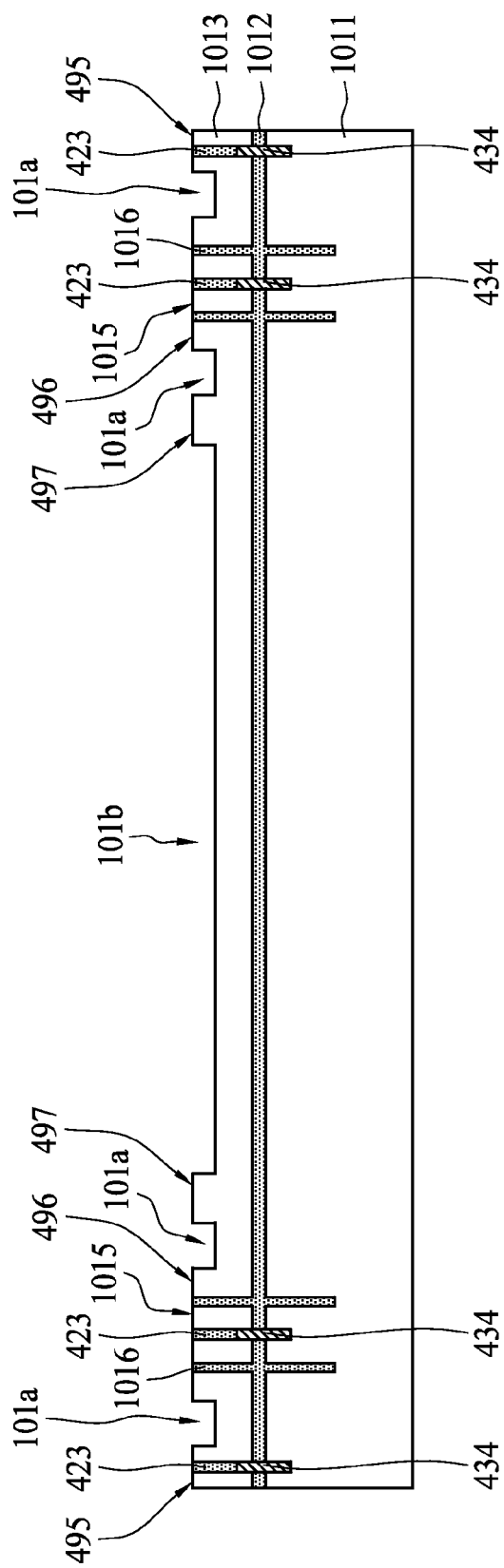
Figure 16:
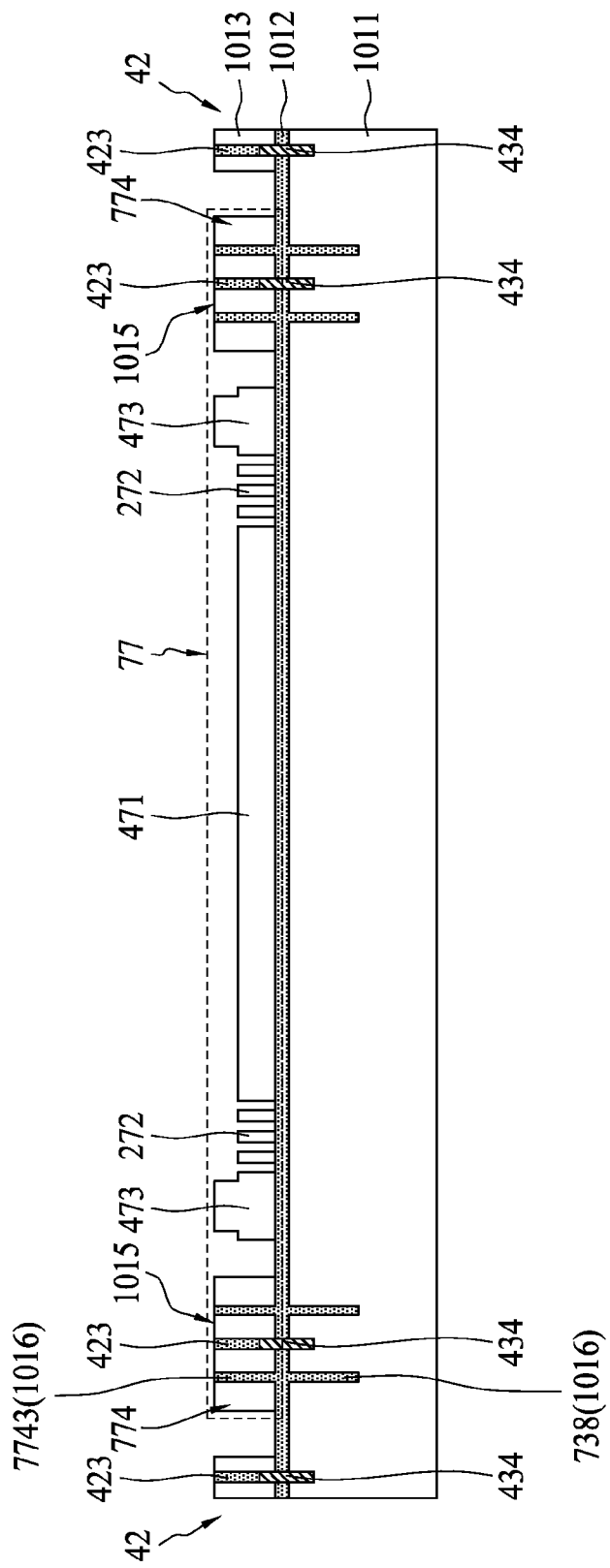

As shown in FIG. 15, the device layer 1013 is etched to form the bottom of the sealing ring 495, the bottom of a supporting base 496 and the bottom of base 497. The recess 101b is designed to form the microelectromechanical system device later and it can be formed by the same etching process at the same time. As shown in FIG. 16, a microelectromechanical system device 77 is partially formed by etching the patterned device layer to the insulating layer 1012, and the microelectromechanical system device 77 comprises a plurality of bases 473, a plurality of supporting bases 774 and at least one sensing element 471. Meanwhile, the sealing ring 42 is also formed by etching the patterned device layer to the insulating layer 1012 at the same time.

Figure 17:
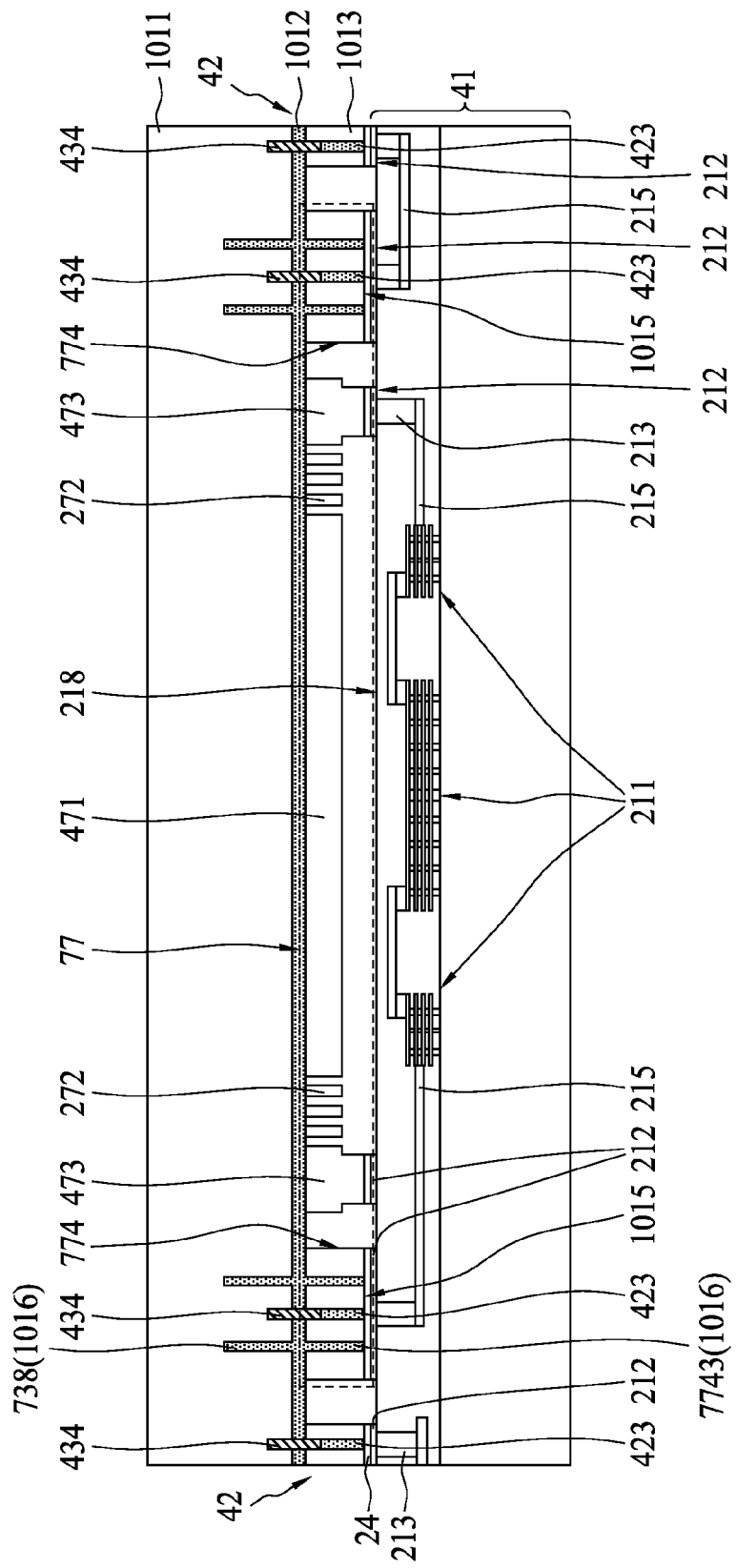
Figure 18:
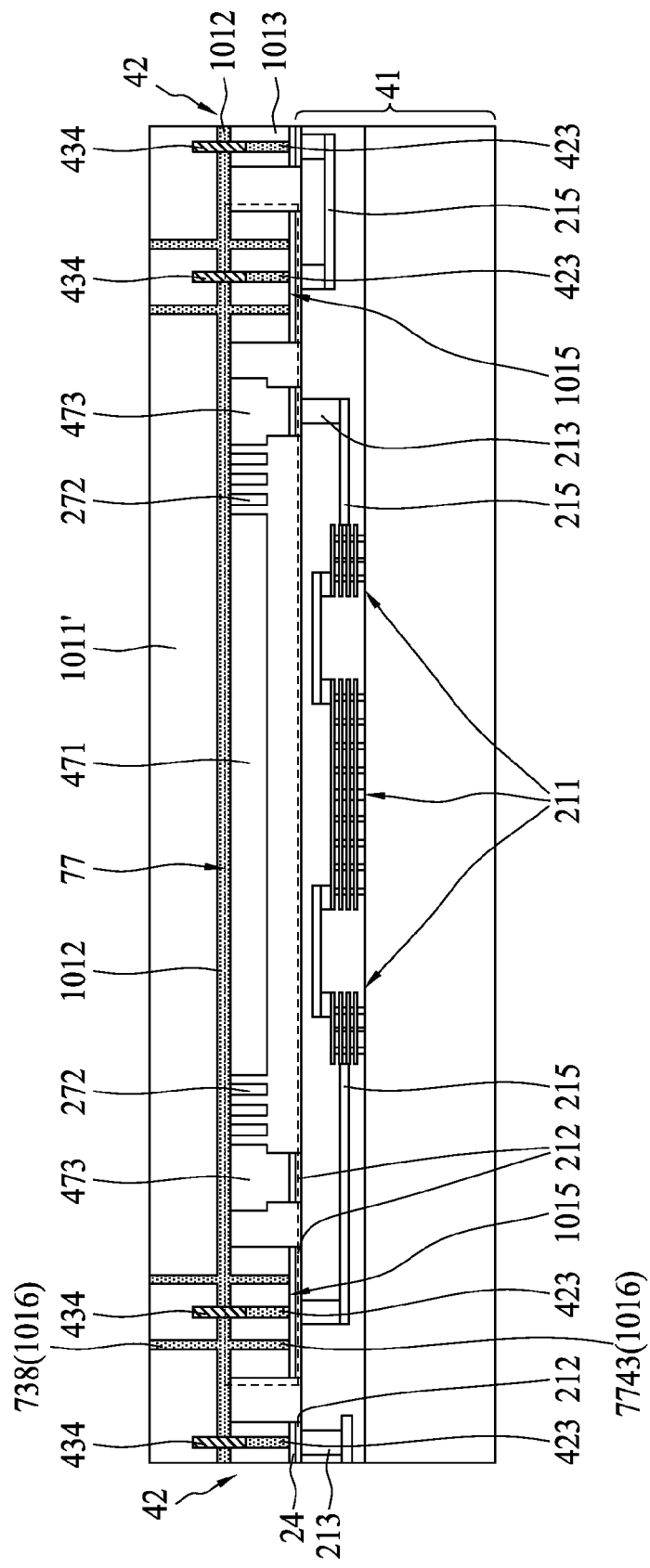

As shown in FIG. 17, by wafer-to-wafer bonding process, the SOI (Silicon on Insulator) wafer having the partially formed microelectromechanical system device 77 and the sealing ring 42 in FIG. 16 is bonded with the circuit chip wafer having a plurality of circuit chips 41. In the embodiment, a plurality of metal bonding areas 212 of the circuit chip 41 are bonded with the bases 473, the supporting bases 774 and sealing ring 42 of the microelectromechanical system device 77 by a conductive bonding material 24. In the embodiment, the bonding process can be a wafer-to-wafer process, which is suit for mass production. Then, the thickness of the handle layer 1011 is thinned so as to be beneficial to the next processes, as shown in FIG. 18.

Figure 19:
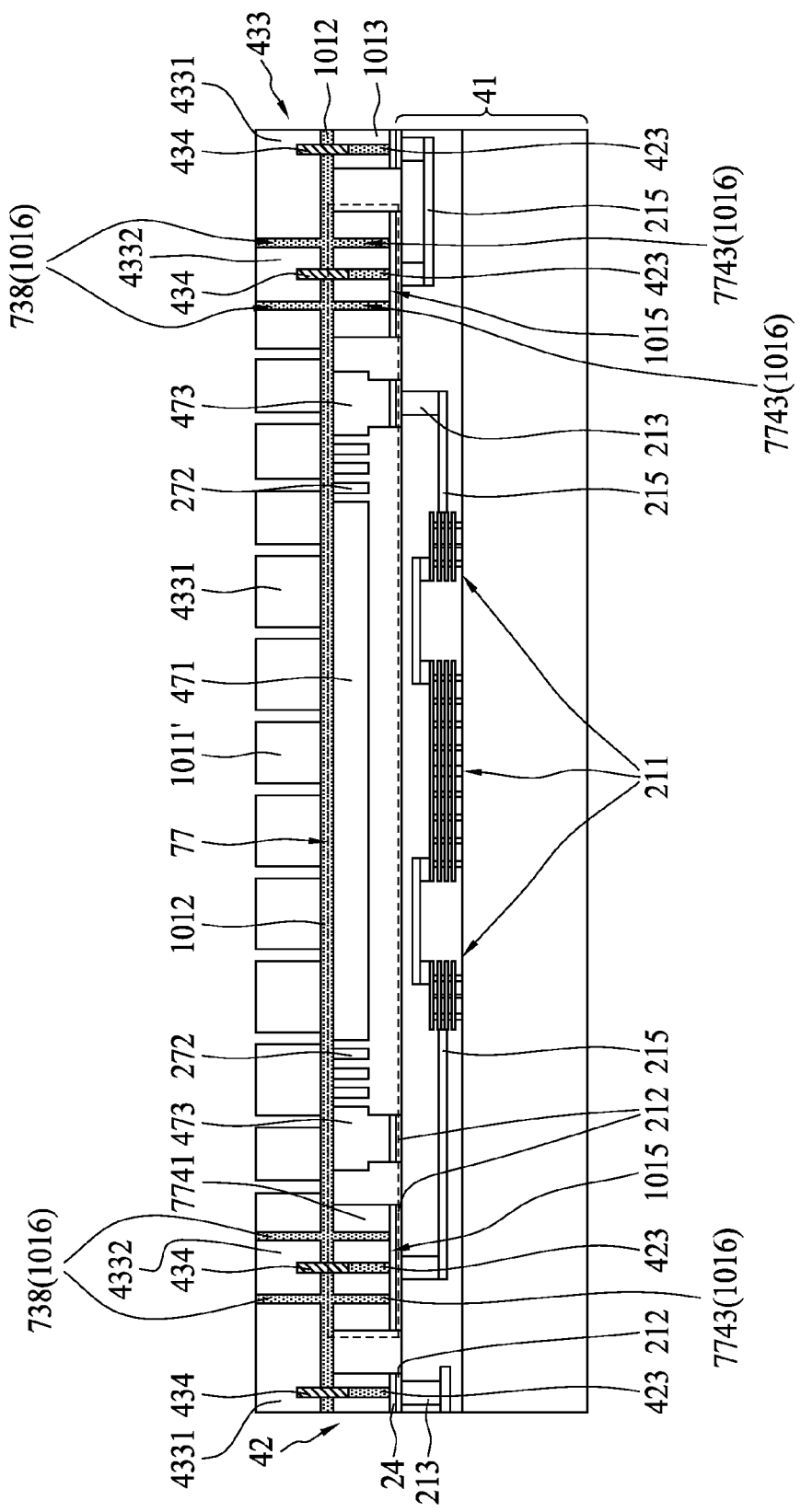

As shown in FIG. 19, a second silicon layer 433 in FIG. 7A is formed by etching the thinned handle layer 1011'. The second silicon layer 433 comprises a foundation 4331 and a plurality of island sections 4332. The island sections 4332 and the foundation 4331 are electrically insulated from each other by the second ring insulating wall 738 which is disposed therebetween. The second ring insulating wall 738 is formed by insulating material 1016 disposed in the handle layer 1011 in FIG. 11, and the first ring insulating wall 7743 is also formed by insulating material 1016 disposed in the device layer 1013 in FIG. 11.

Figure 20:
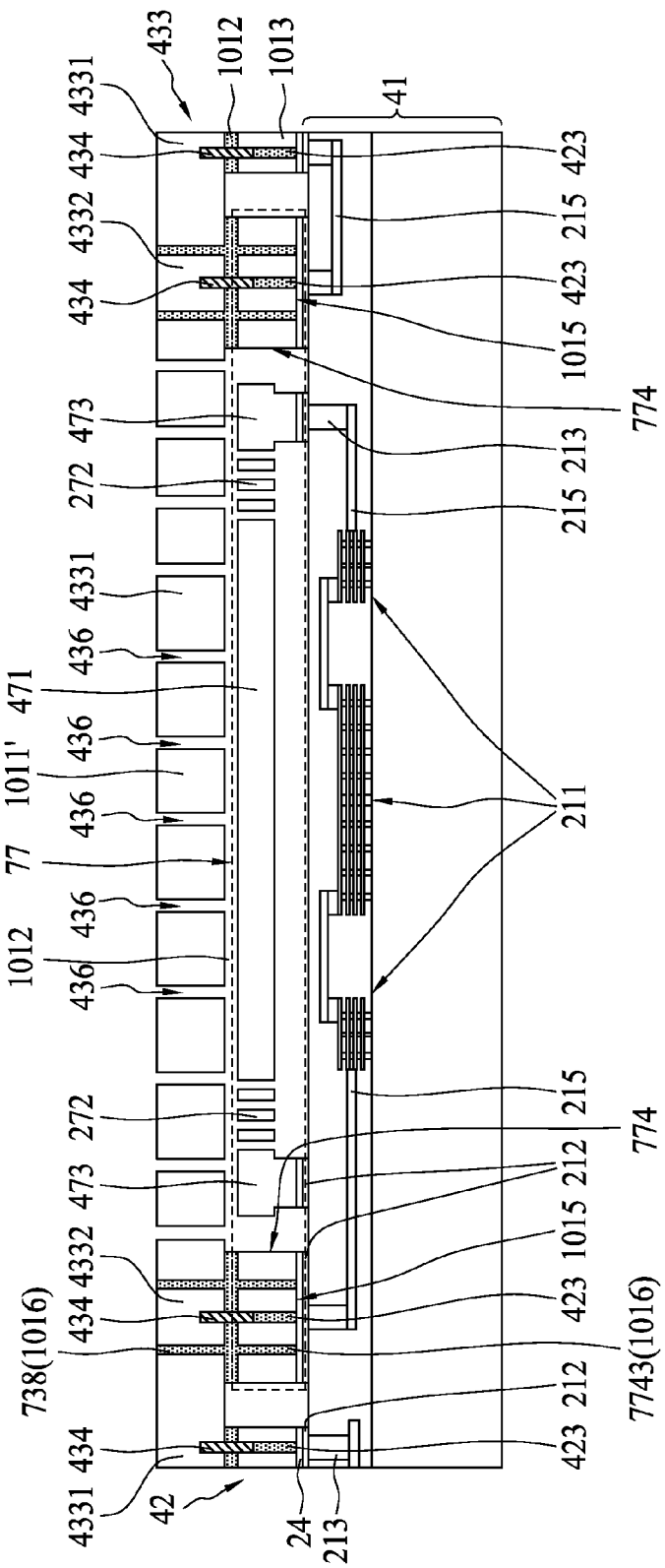

Referring to FIG. 20, there are the plurality of the second holes 436 at the foundation 4331, and these second holes 436 provide channels for etchant to flow during an etching process. That is, etchant can flow into the second holes 436 and remove the insulating layer 1012 disposed at the bottom of the second silicon layer 433 except for the portions of the insulating layer 1012 disposed on sealing ring 42 and on supporting base 774.

Figure 21:
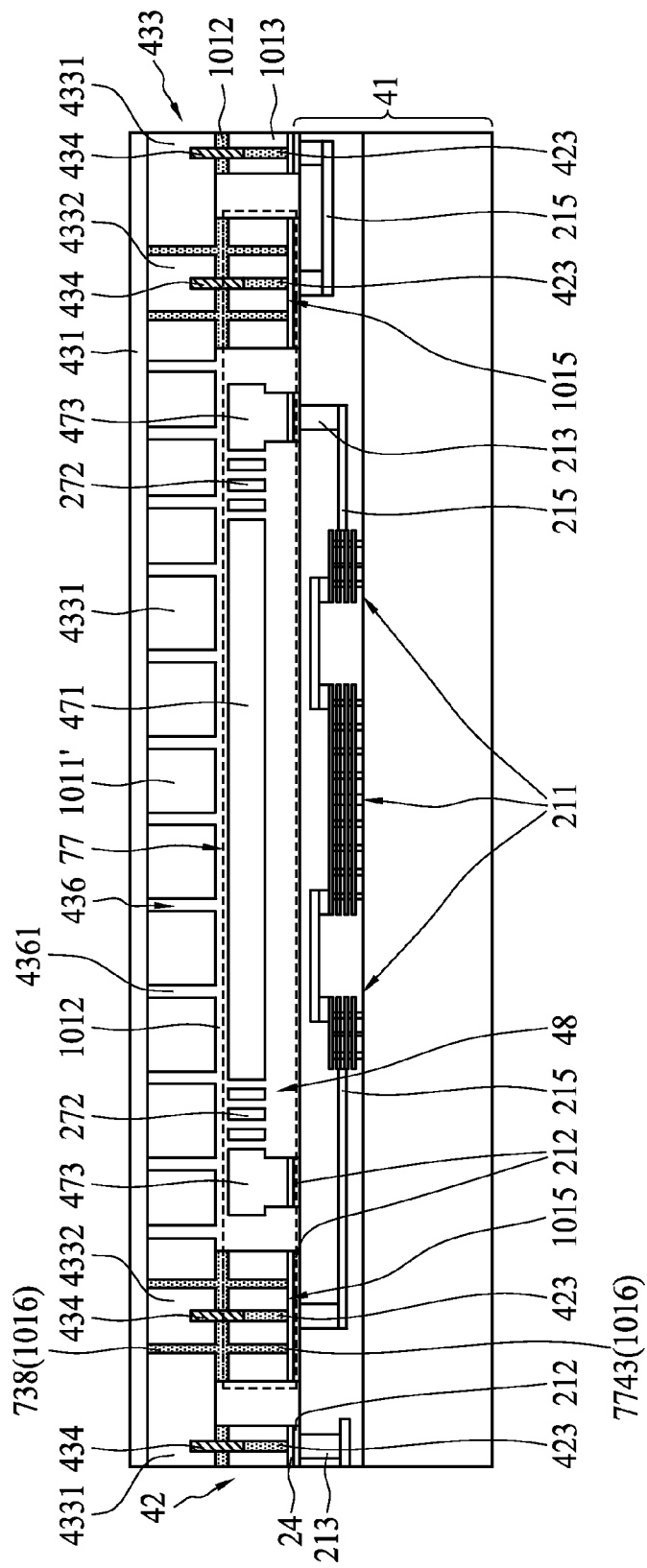

As shown in FIG. 21, an isolation layer 431 for electrical insulation is formed on the upper surface of the second silicon layer 433, so as to seal the first opening 4361 of the second holes 436 of the second silicon layer 433, thus a hermetic chamber 48 is formed.

Figure 22:
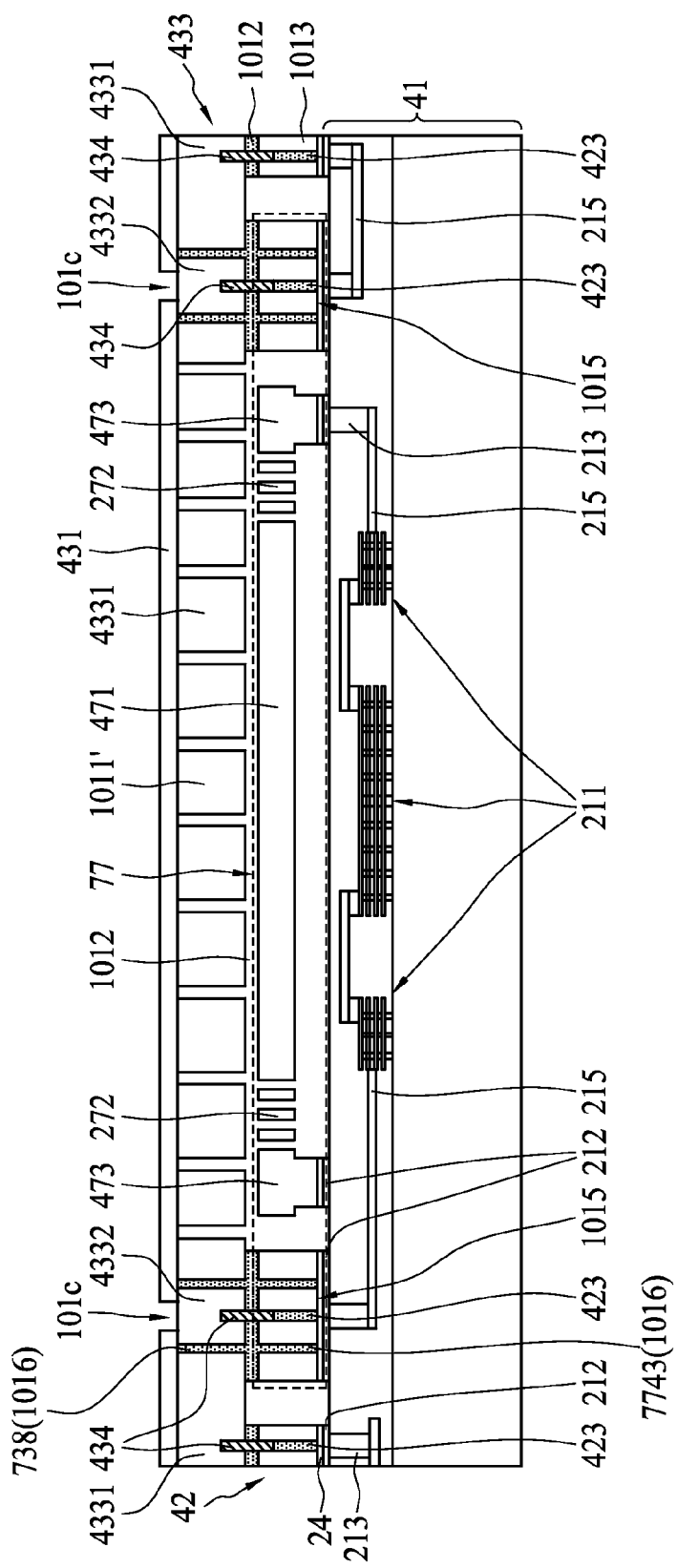
Figure 23:
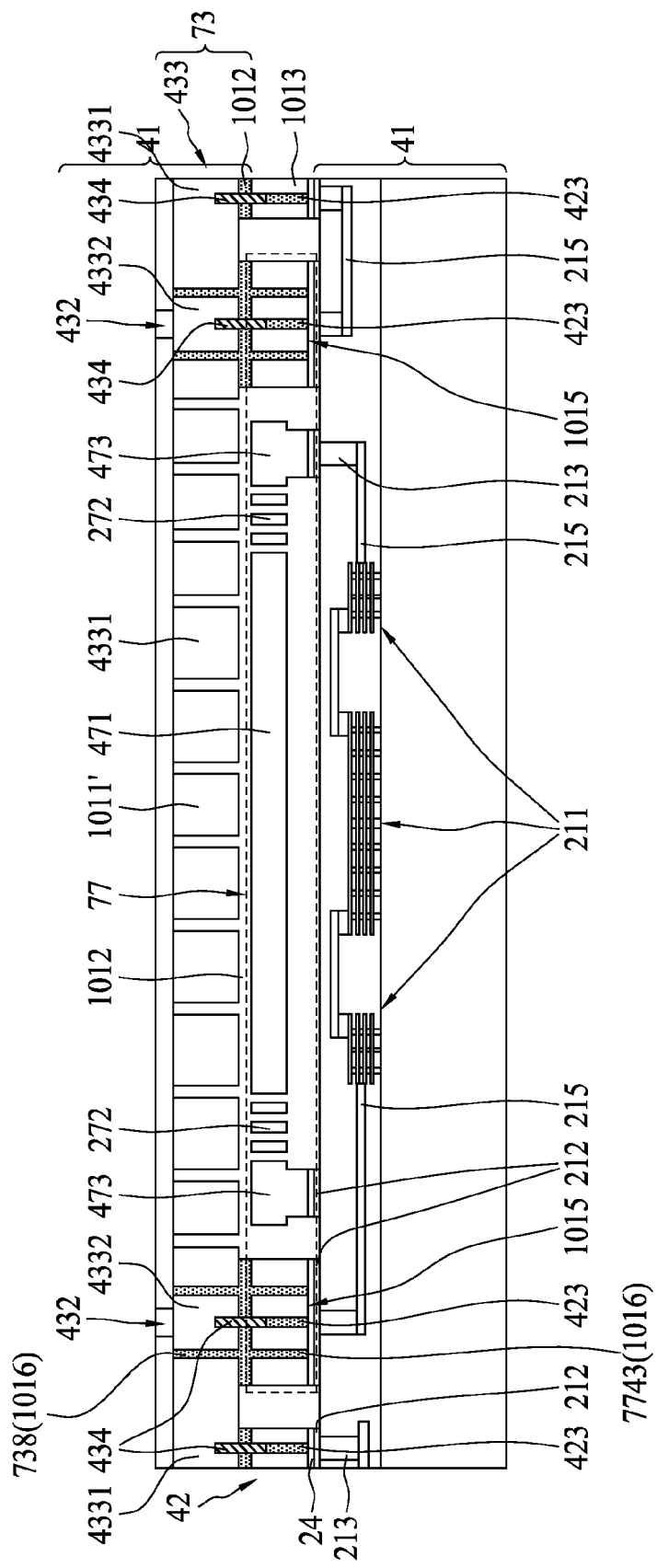

As shown in FIGS. 22 and 23, a plurality of second openings 101c are formed on the isolation layer 431. And by metal depositing, a plurality of conductive pads 432 are formed in the second openings 101c respectively. Then the integrated apparatus 70 in FIG. 7A is completed. (except for the solder balls 26).

Figure 24:
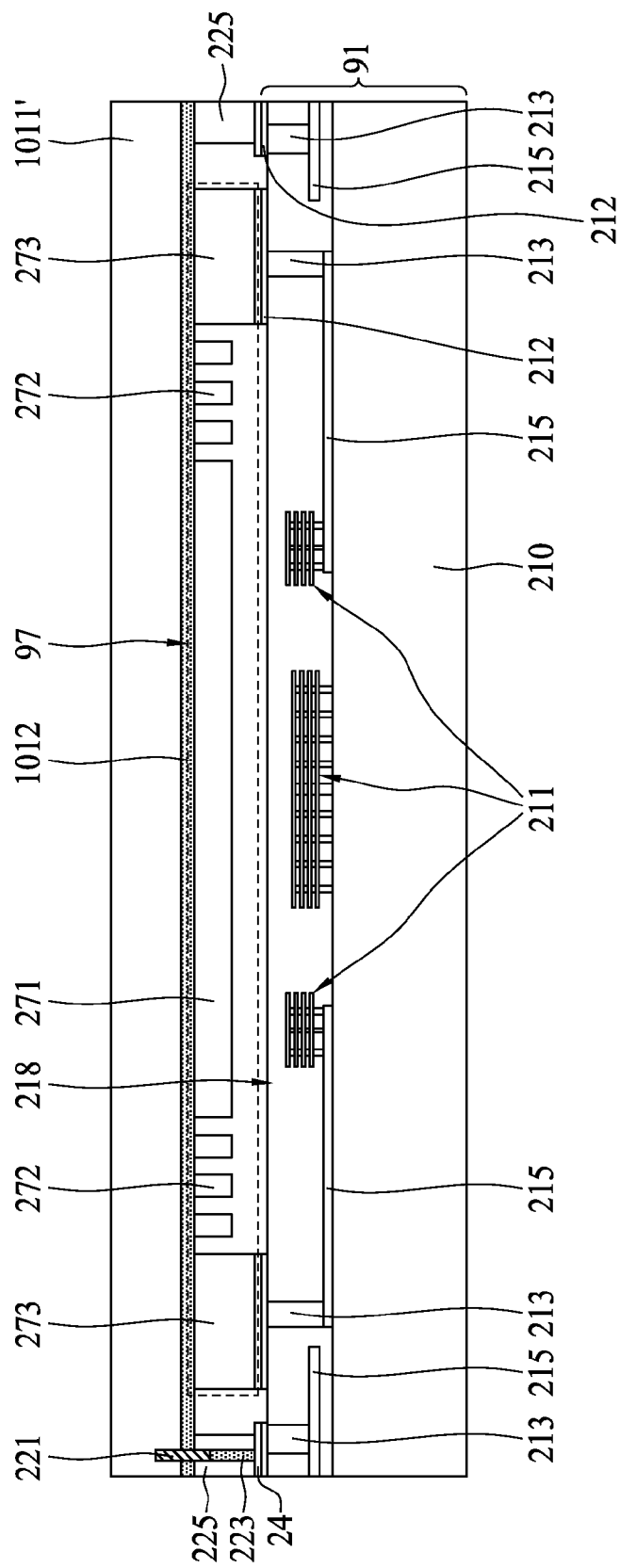
FIGS. 24 to 27 are schematic views of the fabricating steps of an integrated apparatus according to an embodiment.
Figure 25:
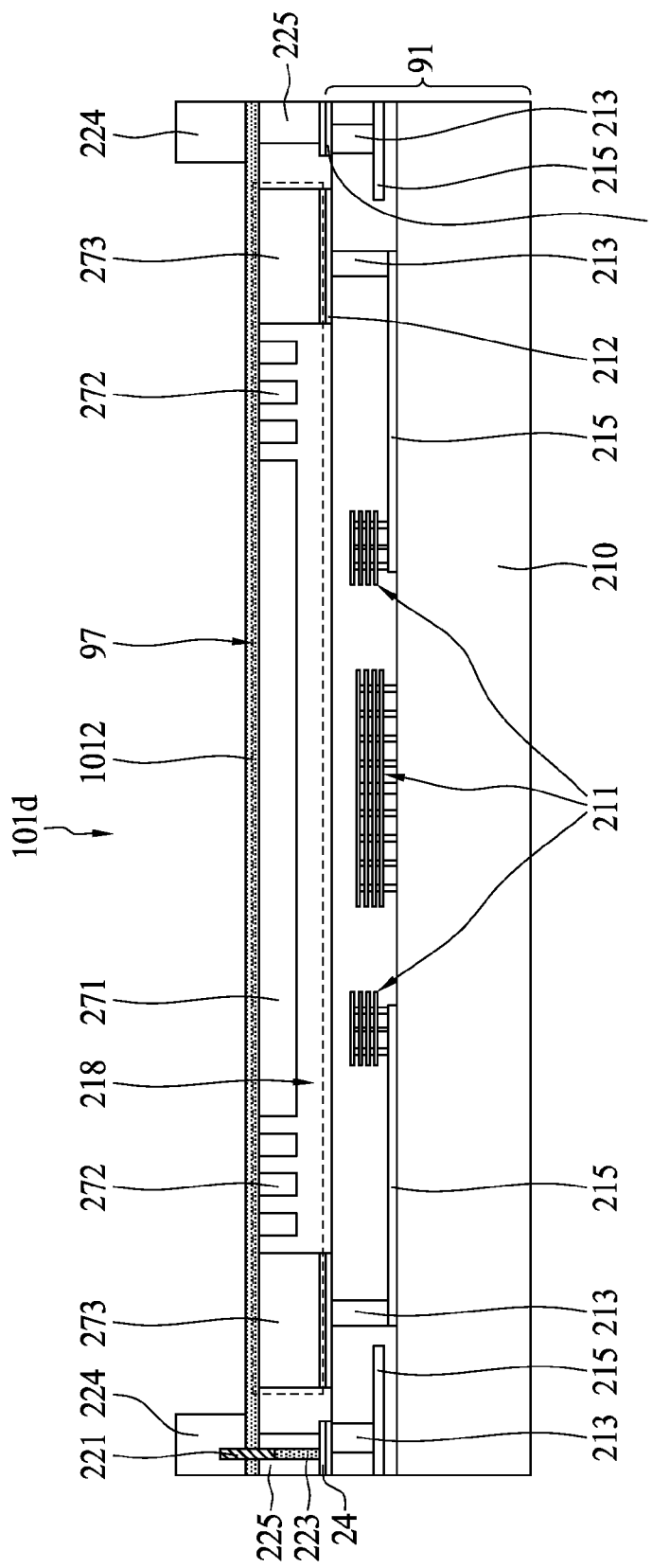
Figure 26:
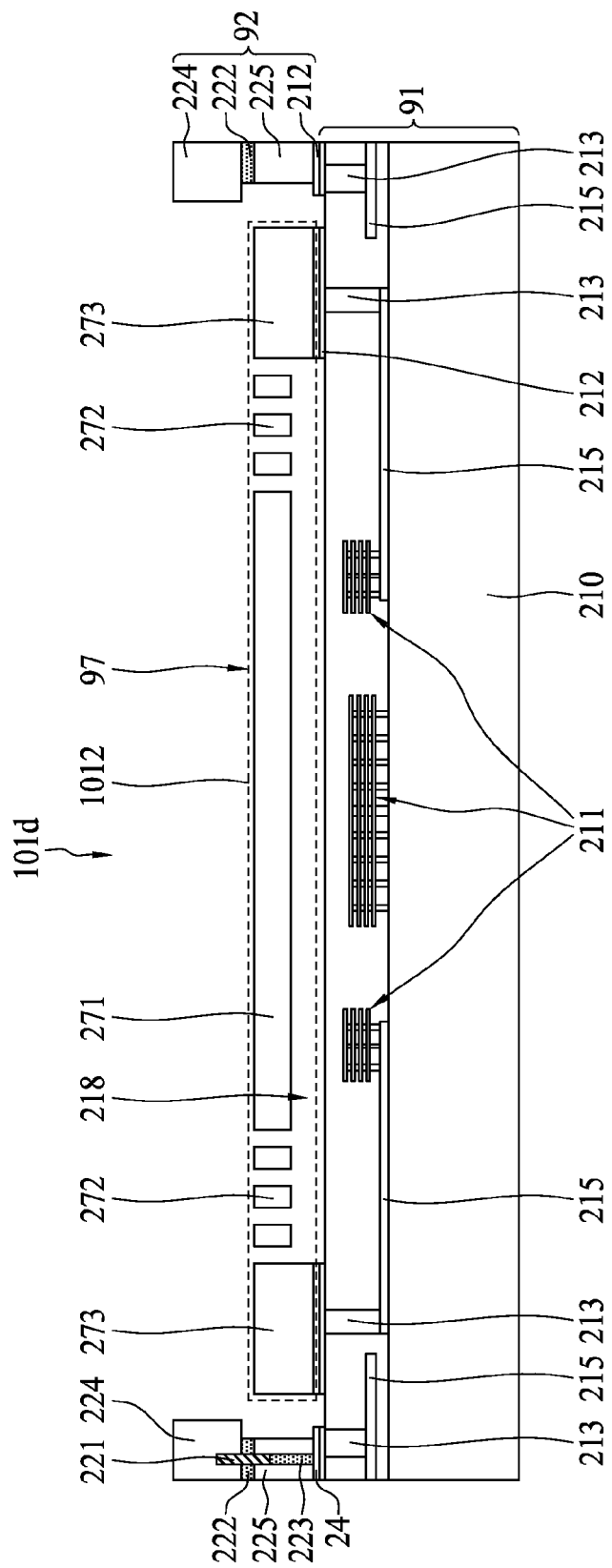

FIGS. 24 to 26 are schematic views of the fabricating steps of an integrated apparatus according to an embodiment of the disclosure, and the figures correspond to the fabricating steps of the integrated apparatus 20 in FIG. 2. In comparison with FIGS. 17 and 18, the bonding process is by wafer-to-wafer bonding process in FIG. 24. In FIG. 24, there is no the first ring insulating wall 7743, the second ring insulating wall 738 and the supporting base. The SOI (Silicon on Insulator) wafer having the microelectromechanical system device 97 and part of the sealing ring is bonded with the circuit chip wafer having a plurality of circuit chips 91. In the embodiment, the bottom of the base 273 and the bottom of the silicon layer 225 of the sealing ring are connected to the metal bonding area 212 of the circuit chip 91 by the conductive bonding material 24.

As shown in FIG. 24, the thinned handle layer 1011' is etched to form a central recess 101d as shown in FIG. 25. The insulating layer 1012 is exposed to the bottom surface of the central recess 101d. As shown in FIG. 26, the insulating layer 1012 is removed except for the portion of the insulating layer 1012 disposed in the sealing ring 92.

Figure 27:
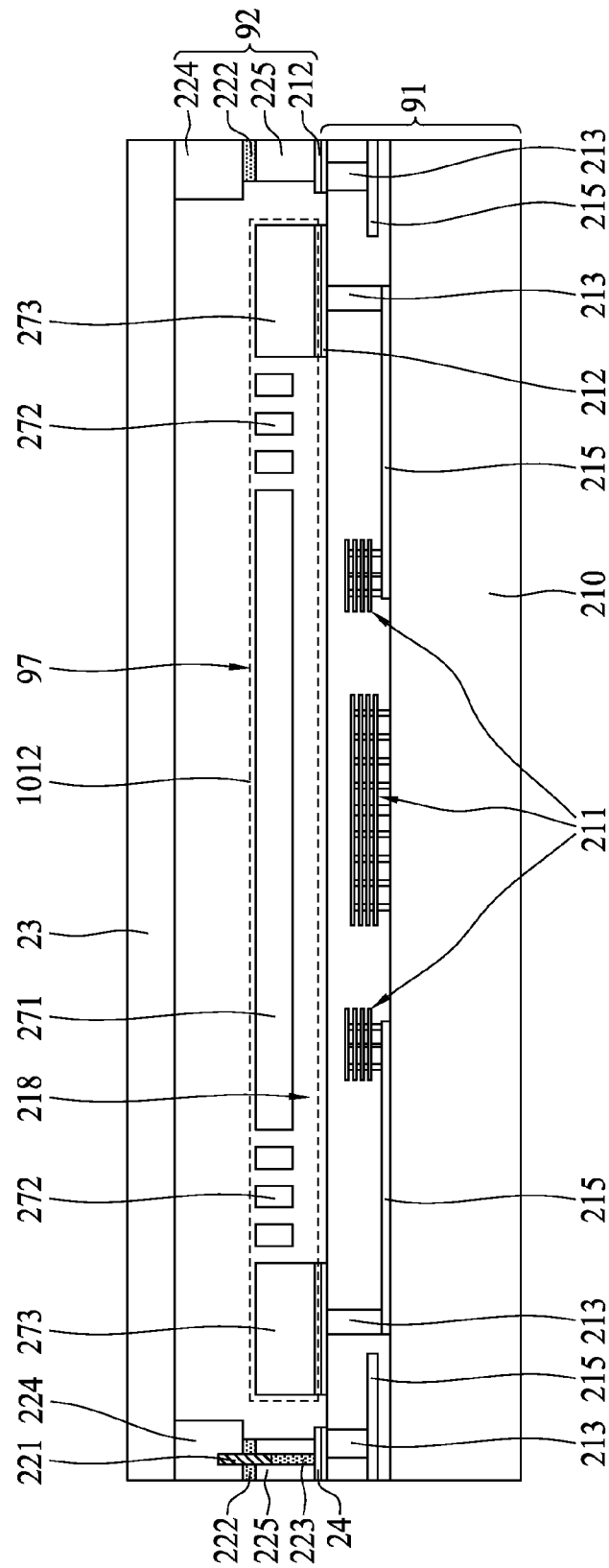

As shown in FIG. 27, a metal lid 23 is fixed on the silicon layer 224 of the sealing ring 92. The metal lid 23 can also be connected with the silicon layer 224 of the sealing ring 92 by a wafer-to-wafer process.

Figure 28:
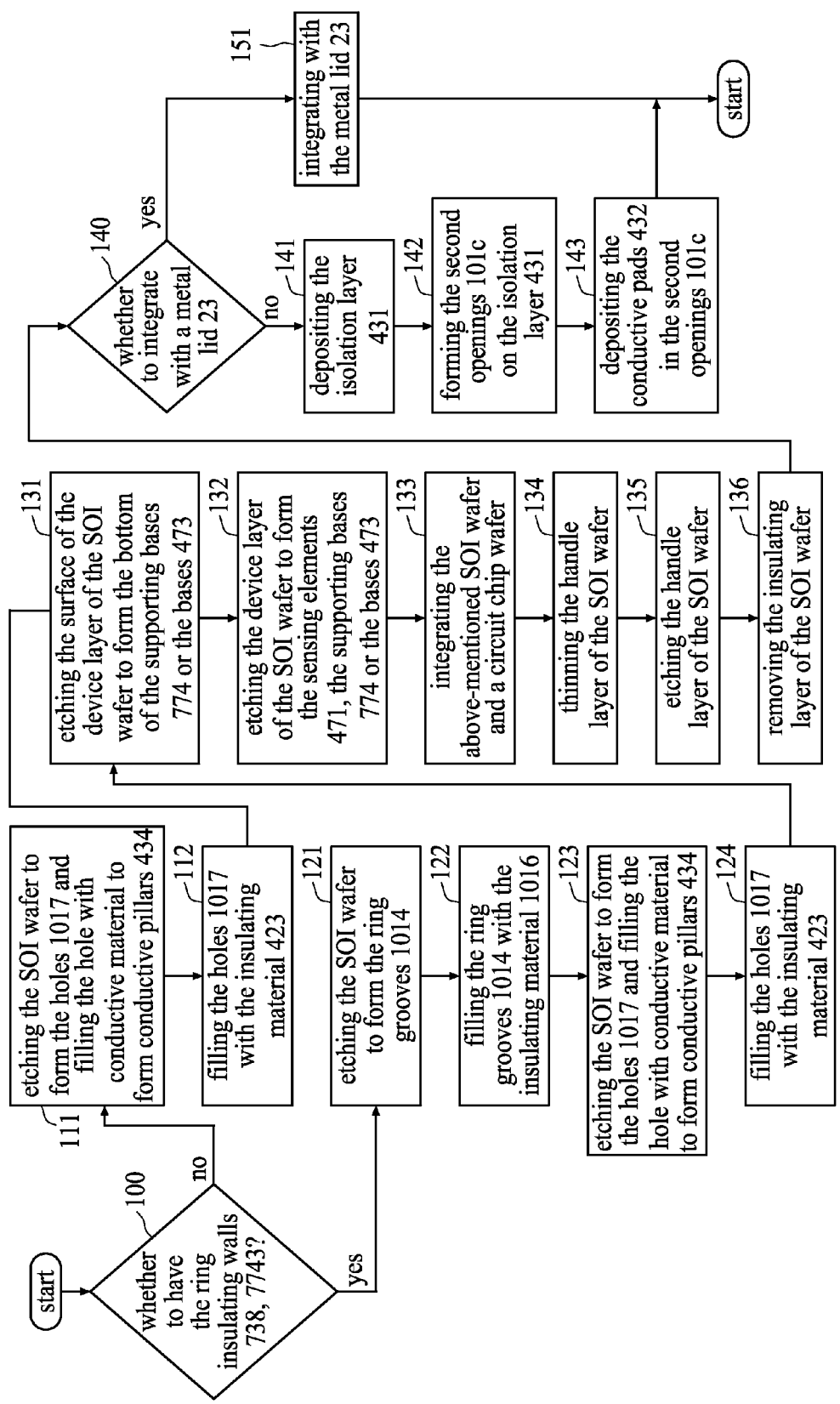
FIG. 28 is a flow chart of the fabricating steps of an integrated apparatus according to an embodiment.

FIG. 28 is a flow chart of the fabricating steps of an integrated apparatus according to an embodiment of the disclosure. To facilitate understanding of the elements and the structures in the flow chart, the reference numbers correspond to the above-mentioned and relating elements or structures in the embodiments; but the contents of the disclosure are not limited by the reference numbers. Moreover, the flow chart is drawn to generalize and integrate the above-mentioned fabricating steps; various changes can be made to the fabricating steps of the disclosure by persons skilled in the art.

As shown in Step 100, a step is proceeded to decide whether to have the ring insulating walls 738, 7743 in the integrated apparatuses or not. If the step is decided to not have the ring insulating walls 738, 7743, Step 111 is proceeded to etch the SOI (Silicon on Insulator) wafer so as to form the first holes 1017 and to fill the conductive material into the first holes 1017 to form the conductive pillars 434. Then, the first holes 1017 are filled with the insulating material 423, as shown in Step 112.

If the step is decided to have the ring insulating walls 738, 7743, Step 121 is proceeded to etch the SOI wafer so as to form the ring grooves 1014. The ring grooves 1014 are then filled with the insulating material 1016, as shown in Step 122. Step 123 and Step 124 are the same as the above-mentioned Step 111 and Step 112.

After Step 112 or Step 124 is finished, Step 131 is then proceeded to etch the surface of the device layer of the SOI wafer so as to form the bottom of the supporting bases 774 or the bottom of the bases 473. Then, the device layer of the SOI wafer is etched so as to form the sensing elements 471, the supporting bases 774 or the bases 473, as shown in Step 132. Utilizing a wafer-to-wafer process, the above-mentioned SOI wafer having etched pattern is integrated with a circuit chip wafer as shown in Step 133. The handle layer of the SOI wafer is thinned, as shown in Step 134. Part of the thinned handle layer of the SOI wafer is removed by etching, as shown in Step 135. Then, part of the insulating layer of the SOI wafer is removed by etching, as shown in Step 136.

Next, a step is proceeded to decide whether to integrate with a metal lid 23 or not, as shown in Step 140. If the step is decided to integrate with a metal lid 23, Step 151 is proceeded to integrate with the metal lid 23. If the step is decided to not integrate with the metal lid 23, Step 141 is proceeded to deposit the isolation layer 431 on the surface of the handle layer of the SOI (Silicon on Insulator) wafer. Then, the second openings 101c are formed on the isolation layer 431 in Step 142, and a plurality of conductive pads 432 are deposited in the second openings 101c in Step 143.

Although the disclosure and its objectives have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the application is not intended to be limited to the particular embodiments of the process, machine, manufacture, composition of matter, means, methods and steps described in the specification. As one of ordinary skill in the art will readily appreciate from the disclosure of the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps.

We claim:

1. A method for fabricating an apparatus integrating a microelectromechanical system device with a circuit chip, comprising:
   providing an SOI (Silicon on Insulator) wafer, wherein the SOI wafer comprises a device layer, an insulating layer and a handle layer stacked in order;
   etching from the device layer through the insulating layer so as to form a plurality of ring grooves and a plurality of pillars disposed at the center of the ring grooves;
   forming a plurality of first holes at the center of each of the pillars, wherein the first holes penetrate the insulating layer and are filled with the conductive material;
   etching the surface of the device layer so as to form a bottom of sealing ring, a plurality of bottoms of a plurality of supporting bases and a plurality of bottoms of a plurality of bases;
   etching the device layer to the insulating layer so as to form an etched pattern;
   integrating the above-mentioned device layer having etched pattern with a circuit chip, wherein the bottom of the sealing ring, the bottoms of the bases and the bottoms of the supporting bases are connected to a plurality of metal bonding areas of the circuit chip;
   forming a plurality of second holes on the handle layer;
   forming at least one sensing element, a plurality of springs, a sealing ring, the at least one bases and the at least one supporting bases; and
   covering an isolation layer on a surface of the handle layer so as to form a hermetic chamber surrounding the at least one sensing element and an active surface of the circuit chip.

2. The method as claimed in claim 1, further comprising a step of forming a plurality of openings at the position where the isolation layer is aligned with the supporting bases, and forming a plurality of conductive pads in the openings.

3. The method as claimed in claim 1, further comprising a step of filling an insulating material in the ring grooves.

4. The method as claimed in claim 3, wherein the interior of each of the supporting bases comprises one of the ring grooves filled with the insulating material.

5. The method as claimed in claim 1, further comprising a step of thinning the thickness of the handle layer before forming the second holes on the handle layer.

6. The method as claimed in claim 1, further comprising a step of filling the insulating material in the first hole after filling the conductive material in the first hole.

7. The method as claimed in claim 1, wherein the step of forming at least one sensing element, a plurality of springs, a sealing ring, the at least one bases and the at least one supporting bases includes a step of removing the insulating layer disposed above the device layer.

8. A method for fabricating an apparatus integrating a microelectromechanical system device with a circuit chip, comprising:
   providing an SOI (Silicon on Insulator) wafer, wherein the SOI wafer comprises a device layer, an insulating layer and a handle layer stacked in order;
   etching a surface of the device layer so as to form a bottom of a sealing ring, a plurality of bottoms of a plurality of supporting bases and a plurality of bottoms of a plurality of bases;
   etching the device layer to the insulating layer so as to form an etched pattern;
   integrating the above-mentioned device layer having etched pattern with a circuit chip, wherein the bottom of the sealing ring, the plurality of bottoms of the plurality of bases and the plurality of bottoms of the plurality of supporting bases are connected to a plurality of metal bonding areas of the circuit chip;
   forming a plurality of second holes on the handle layer; and
   forming at least one sensing element, the sealing ring, the plurality of supporting bases, the plurality of bases and a lid, wherein the step of forming the at least one sensing element, the sealing ring, the plurality of supporting bases, the plurality of bases and the lid is implemented after the step of integrating the above-mentioned device layer having etched pattern with the circuit chip.

9. The method as claimed in claim 8, further comprising a step of etching from the device layer through the insulating layer so as to form a plurality of ring grooves and a plurality of pillars disposed at the center of the ring grooves.

10. The method as claimed in claim 9, further comprising a step of forming a first hole at the center of each of the pillars, wherein the first hole penetrates the insulating layer and is filled with a conductive material to form at least one conductive pillar.

11. The method as claimed in claim 8, further comprising a step of covering an isolation layer on a surface of the handle layer so as to form a hermetic chamber surrounding the at least one sensing element.

12. The method as claimed in claim 8, wherein the step of forming at least one sensing element, the sealing ring, the plurality of supporting bases, the plurality of bases and a lid includes a step of removing the insulating layer disposed above the device layer.

13. A method for fabricating an apparatus integrating a microelectromechanical system device with a circuit chip, comprising:
   providing an SOI (Silicon on Insulator) wafer, wherein the SOI wafer comprises a device layer, an insulating layer and a handle layer stacked in order;
   etching from the device layer through the insulating layer so as to form a plurality of ring grooves and a plurality of pillars disposed at the center of the ring grooves;
   forming a first hole at the center of each of the plurality of pillars, wherein the first hole penetrates the insulating layer and is filled with a conductive material to form at least one conductive pillar;
   etching the device layer to the insulating layer so as to form an etched pattern;
   integrating the above-mentioned device layer having etched pattern with a circuit chip;
   forming a plurality of second holes on the handle layer; and
   forming at least one sensing element, a plurality of supporting bases, a sealing ring, and a lid wherein the sealing ring comprises a first silicon layer, the lid comprises an insulating layer, a second silicon layer and a plurality of the conductive pillars, wherein the first silicon layer and the second silicon layer clip the insulating layer, and the plurality of the conductive pillars penetrate the insulating layer and connect the first silicon layer and the second silicon layer.

14. The method us as claimed in claim 13, further comprising a step of filling an insulating material in the plurality of ring grooves.

15. The method as claimed in claim 13, further comprising a step of etching a surface of the device layer so as to form a bottom of the sealing ring, a plurality of bottoms of the plurality of supporting bases and a plurality of bottoms of a plurality of bases.

16. The method as claimed in claim 13, wherein the second silicon layer further comprises a foundation and a plurality of island sections, the plurality of island sections and the foundation are electrically insulated from each other, and the island sections are respectively connected to the plurality of supporting bases by the insulating layer.

17. The method as claimed in claim 16, further comprising a step of covering an isolation layer on a surface of the handle layer so as to form a hermetic chamber surrounding the at least one sensing element.

18. The method as claimed in claim 17, wherein the second silicon layer further comprising a plurality of ring air gaps disposed between the plurality of island sections and the foundation.

19. The method us as claimed in claim 14, wherein the second silicon layer further comprising a plurality of second ring insulating walls disposed between the plurality of island sections and the foundation.

20. The method as claimed in claim 17, wherein the second silicon layer includes the plurality of second holes and the isolation layer, and the isolation layer seals first openings disposed on an end of each of the second holes.

21. The method as claimed in claim 20, further comprising a plurality of conductive pads respectively disposed in openings of the isolation layer and is connected to the plurality of island sections.

22. The method as claimed in claim 19, wherein the plurality of supporting bases and the sealing ring are spaced apart by the insulating material and the insulating material surrounds each of the plurality of supporting bases so as to form a first ring insulating wall, and each of the first ring insulating walls penetrates the first silicon layer.

23. The method as claimed in claim 19, wherein the plurality of supporting bases and the sealing ring are spaced apart, and each of the plurality of supporting bases is embedded with a first ring insulating wall, and each of the first ring insulating walls penetrates the first silicon layer.

24. The method as claimed in claim 23, wherein each of the plurality of supporting bases is aligned with one of the plurality of island sections, and the first ring insulating wall is aligned with the second ring insulating wall.

25. The method as claimed in claim 17, wherein the at least one conductive pillar penetrates the first silicon layer, the plurality of island sections of the second silicon layer and the insulating layer disposed between the plurality of supporting bases and the plurality of island sections.

26. The method as claimed in claim 13, wherein the step of removing the insulating layer to form the at least one sensing element, the plurality of supporting bases, the sealing ring, and the lid is implemented after the step of integrating the above-mentioned device layer having etched pattern with the circuit chip.

27. The method as claimed in claim 13, wherein the step of forming at least one sensing element, a plurality of supporting bases, a sealing ring, and a lid includes a step of removing the insulating layer disposed above the device layer.

* * * * *